US009123574B2

(12) United States Patent
Yamazaki et al.

(10) Patent No.: US 9,123,574 B2
(45) Date of Patent: *Sep. 1, 2015

(54) SEMICONDUCTOR DEVICE

(71) Applicant: Semiconductor Energy Laboratory Co., Ltd., Atsugi-shi, Kanagawa-ken (JP)

(72) Inventors: Shunpei Yamazaki, Tokyo (JP); Jun Koyama, Kanagawa (JP); Kiyoshi Kato, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/105,250

(22) Filed: Dec. 13, 2013

(65) Prior Publication Data

US 2014/0175431 A1  Jun. 26, 2014

Related U.S. Application Data

(63) Continuation of application No. 12/966,611, filed on Dec. 13, 2010, now Pat. No. 8,610,187.

(30) Foreign Application Priority Data

Dec. 18, 2009 (JP) ................................ 2009-288474
Dec. 25, 2009 (JP) ................................ 2009-294790

(51) Int. Cl.
*H01L 21/8239* (2006.01)
*H01L 21/8242* (2006.01)
(Continued)

(52) U.S. Cl.
CPC .... *H01L 27/10805* (2013.01); *H01L 27/10855* (2013.01); *H01L 27/1156* (2013.01);
(Continued)

(58) Field of Classification Search
CPC .............. H01L 27/108; H01L 27/1082; H01L 27/10855; H01L 27/1108; H01L 27/1225
USPC ............. 257/68, 71, 213, 206, 288, 296–298, 257/300, 306–309, 311, 349, 365, 401, 257/E27.011, E27.016, E27.084, E27.086, 257/E27.088, E27.094, E21.645–E21.649, 257/906; 438/210, 238, 239, 253, 256; 365/72, 63, 145, 189.9, 189.11, 365/230.06, 227

See application file for complete search history.

(56) References Cited

U.S. PATENT DOCUMENTS

| 4,466,081 A | 8/1984 | Masuoka |
| 5,079,180 A | 1/1992 | Rodder et al. |

(Continued)

FOREIGN PATENT DOCUMENTS

| EP | 0601590 A | 6/1994 |
| EP | 0971360 A | 1/2000 |

(Continued)

OTHER PUBLICATIONS

Ohara, H et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

(Continued)

*Primary Examiner* — Laura Menz
*Assistant Examiner* — Maliheh Malek
(74) *Attorney, Agent, or Firm* — Fish & Richardson P.C.

(57) ABSTRACT

A first transistor including a channel formation region, a first gate insulating layer, a first gate electrode, and a first source electrode and a first drain electrode; a second transistor including an oxide semiconductor layer, a second source electrode and a second drain electrode, a second gate insulating layer, and a second gate electrode; and a capacitor including one of the second source electrode and the second drain electrode, the second gate insulating layer, and an electrode provided to overlap with one of the second source electrode and the second drain electrode over the second gate insulating layer are provided. The first gate electrode and one of the second source electrode and the second drain electrode are electrically connected to each other.

24 Claims, 15 Drawing Sheets

(51) Int. Cl.
*H01L 27/115* (2006.01)
*H01L 27/12* (2006.01)
*H01L 49/02* (2006.01)
*H01L 29/786* (2006.01)
*H01L 27/108* (2006.01)
*G11C 16/04* (2006.01)
*H01L 21/285* (2006.01)
*H01L 29/66* (2006.01)

(52) U.S. Cl.
CPC ...... *H01L27/11517* (2013.01); *H01L 27/1207* (2013.01); *H01L 27/1225* (2013.01); *H01L 28/40* (2013.01); *H01L 29/7869* (2013.01); *G11C 16/0416* (2013.01); *H01L 21/28518* (2013.01); *H01L 29/6659* (2013.01)

(56) References Cited

U.S. PATENT DOCUMENTS

| | | |
|---|---|---|
| 5,349,366 A | 9/1994 | Yamazaki et al. |
| 5,428,238 A | 6/1995 | Hayashi et al. |
| 5,506,436 A | 4/1996 | Hayashi et al. |
| 5,576,571 A | 11/1996 | Hayashi et al. |
| 5,578,852 A | 11/1996 | Hayashi et al. |
| 5,578,853 A | 11/1996 | Hayashi et al. |
| 5,581,106 A | 12/1996 | Hayashi et al. |
| 5,731,856 A | 3/1998 | Kim et al. |
| 5,744,864 A | 4/1998 | Cillessen et al. |
| 6,022,770 A | 2/2000 | Hook et al. |
| 6,064,091 A | 5/2000 | Deane et al. |
| 6,066,881 A | 5/2000 | Shimizu et al. |
| 6,088,070 A | 7/2000 | Ohtani et al. |
| 6,127,702 A * | 10/2000 | Yamazaki et al. ............ 257/347 |
| 6,294,274 B1 | 9/2001 | Kawazoe et al. |
| 6,380,009 B1 | 4/2002 | Battersby |
| 6,445,026 B1 | 9/2002 | Kubota et al. |
| 6,563,174 B2 | 5/2003 | Kawasaki et al. |
| 6,649,935 B2 | 11/2003 | Hsu et al. |
| 6,727,522 B1 | 4/2004 | Kawasaki et al. |
| 6,818,487 B2 | 11/2004 | Hsu et al. |
| 6,841,394 B2 | 1/2005 | Kang et al. |
| 6,873,018 B2 | 3/2005 | Bhattacharyya |
| 6,972,986 B2 | 12/2005 | Peng et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,064,973 B2 | 6/2006 | Peng et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,339,235 B1 | 3/2008 | Yamazaki et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,622,736 B2 | 11/2009 | Moriya et al. |
| 7,674,650 B2 | 3/2010 | Akimoto et al. |
| 7,732,819 B2 | 6/2010 | Akimoto et al. |
| 7,791,074 B2 | 9/2010 | Iwasaki |
| 7,935,582 B2 | 5/2011 | Iwasaki |
| 7,956,361 B2 | 6/2011 | Iwasaki |
| 8,154,024 B2 | 4/2012 | Iwasaki |
| 8,202,365 B2 | 6/2012 | Umeda et al. |
| 8,207,063 B2 | 6/2012 | Cowdery-Corvan et al. |
| 8,207,533 B2 | 6/2012 | Maekawa et al. |
| 8,212,248 B2 | 7/2012 | Itagaki et al. |
| 8,384,076 B2 | 2/2013 | Park et al. |
| 8,400,817 B2 | 3/2013 | Yamazaki et al. |
| 8,410,838 B2 | 4/2013 | Kato et al. |
| 8,427,595 B2 | 4/2013 | Yamazaki et al. |
| 8,530,246 B2 | 9/2013 | Ofuji et al. |
| 8,610,187 B2 * | 12/2013 | Yamazaki et al. ............ 257/296 |
| 8,982,589 B2 * | 3/2015 | Shionoiri et al. ............ 363/60 |
| 2001/0023099 A1 | 9/2001 | Saito et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0143800 A1 | 7/2003 | Hall et al. |
| 2003/0189401 A1 | 10/2003 | Kido et al. |
| 2003/0218222 A1 | 11/2003 | Wager, III et al. |
| 2004/0014248 A1 | 1/2004 | Kim |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0073897 A1 * | 4/2005 | Miyatake et al. ............ 365/222 |
| 2005/0128803 A1 | 6/2005 | Luk et al. |
| 2005/0151276 A1 | 7/2005 | Jang et al. |
| 2005/0199959 A1 | 9/2005 | Chiang et al. |
| 2005/0275038 A1 | 12/2005 | Shih et al. |
| 2006/0028859 A1 | 2/2006 | Forbes |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108623 A1 | 5/2006 | Buskirk et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231858 A1 | 10/2006 | Akimoto et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0018163 A1 | 1/2007 | Chiang et al. |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0215869 A1 | 9/2007 | Moriya et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0012076 A1 | 1/2008 | Yamazaki et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0093639 A1 | 4/2008 | Kim |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0224142 A1 | 9/2008 | Cheng et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |

(56) References Cited

U.S. PATENT DOCUMENTS

| | | |
|---|---|---|
| 2008/0258141 A1 | 10/2008 | Park et al. |
| 2008/0258143 A1 | 10/2008 | Kim et al. |
| 2008/0277708 A1 | 11/2008 | Mun |
| 2008/0284933 A1* | 11/2008 | Ito et al. ............... 349/43 |
| 2008/0296568 A1 | 12/2008 | Ryu et al. |
| 2008/0315193 A1 | 12/2008 | Kim et al. |
| 2009/0001360 A1* | 1/2009 | Nakayama ............... 257/40 |
| 2009/0002590 A1 | 1/2009 | Kimura |
| 2009/0008638 A1 | 1/2009 | Kang et al. |
| 2009/0045397 A1 | 2/2009 | Iwasaki |
| 2009/0065780 A1 | 3/2009 | Yasukawa et al. |
| 2009/0068773 A1 | 3/2009 | Lai et al. |
| 2009/0073325 A1 | 3/2009 | Kuwabara et al. |
| 2009/0090948 A1 | 4/2009 | Sato |
| 2009/0098674 A1 | 4/2009 | Yamazaki et al. |
| 2009/0114910 A1 | 5/2009 | Chang |
| 2009/0121233 A1 | 5/2009 | Yasukawa |
| 2009/0127556 A1 | 5/2009 | Takayama et al. |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2009/0285018 A1 | 11/2009 | Luk et al. |
| 2009/0286341 A1 | 11/2009 | Shiota et al. |
| 2010/0055896 A1 | 3/2010 | Abe et al. |
| 2010/0065844 A1 | 3/2010 | Tokunaga |
| 2010/0092800 A1 | 4/2010 | Itagaki et al. |
| 2010/0097838 A1 | 4/2010 | Tanaka et al. |
| 2010/0109002 A1 | 5/2010 | Itagaki et al. |
| 2010/0148171 A1 | 6/2010 | Hayashi et al. |
| 2010/0193785 A1 | 8/2010 | Kimura |
| 2010/0244106 A1 | 9/2010 | Parker et al. |
| 2010/0276685 A1 | 11/2010 | Itagaki et al. |
| 2010/0276689 A1 | 11/2010 | Iwasaki |
| 2010/0279462 A1 | 11/2010 | Iwasaki |
| 2011/0101332 A1 | 5/2011 | Yamazaki et al. |
| 2011/0101334 A1 | 5/2011 | Yamazaki et al. |
| 2011/0101339 A1 | 5/2011 | Yamazaki et al. |
| 2011/0101351 A1 | 5/2011 | Yamazaki |
| 2011/0110145 A1 | 5/2011 | Yamazaki et al. |
| 2011/0121286 A1 | 5/2011 | Yamazaki et al. |
| 2011/0121878 A1 | 5/2011 | Kato et al. |
| 2011/0122670 A1 | 5/2011 | Yamazaki et al. |
| 2011/0134683 A1 | 6/2011 | Yamazaki et al. |
| 2011/0140099 A1 | 6/2011 | Yamazaki |
| 2011/0157961 A1 | 6/2011 | Yamazaki et al. |
| 2011/0175083 A1 | 7/2011 | Sekine et al. |
| 2011/0198593 A1 | 8/2011 | Kato et al. |
| 2011/0212570 A1 | 9/2011 | Yamazaki et al. |
| 2011/0215326 A1 | 9/2011 | Godo et al. |
| 2011/0227074 A1 | 9/2011 | Kato et al. |
| 2012/0001243 A1 | 1/2012 | Kato |
| 2012/0012837 A1 | 1/2012 | Yamazaki et al. |
| 2012/0025191 A1 | 2/2012 | Yamazaki |
| 2012/0033486 A1 | 2/2012 | Inoue et al. |
| 2012/0051119 A1 | 3/2012 | Yamazaki et al. |
| 2012/0056647 A1 | 3/2012 | Nagatsuka et al. |
| 2012/0061664 A1 | 3/2012 | Yamazaki et al. |
| 2012/0074407 A1 | 3/2012 | Yamazaki et al. |
| 2012/0080810 A1 | 4/2012 | Dozen et al. |
| 2012/0112257 A1 | 5/2012 | Kato |
| 2012/0256177 A1 | 10/2012 | Yamazaki |
| 2012/0295399 A1 | 11/2012 | Kim et al. |

FOREIGN PATENT DOCUMENTS

| | | | |
|---|---|---|---|
| EP | 1 583 239 | A2 | 10/2005 |
| EP | 1 737 044 | A1 | 12/2006 |
| EP | 2120267 | A | 11/2009 |
| EP | 2 226 847 | A2 | 9/2010 |
| EP | 2 339 639 | A2 | 6/2011 |
| EP | 2408011 | A | 1/2012 |
| JP | 57-105889 | A | 7/1982 |
| JP | 60-198861 | A | 10/1985 |
| JP | 63-210022 | A | 8/1988 |
| JP | 63-210023 | A | 8/1988 |
| JP | 63-210024 | A | 8/1988 |
| JP | 63-215519 | A | 9/1988 |
| JP | 63-239117 | A | 10/1988 |
| JP | 63-265818 | A | 11/1988 |
| JP | 05-251705 | A | 9/1993 |
| JP | 07-099251 | A | 4/1995 |
| JP | 08-264794 | A | 10/1996 |
| JP | 10-093100 | A | 4/1998 |
| JP | 11-505377 | A | 5/1999 |
| JP | 2000-044236 | A | 2/2000 |
| JP | 2000-150900 | A | 5/2000 |
| JP | 2001-044297 | A | 2/2001 |
| JP | 2001-053164 | A | 2/2001 |
| JP | 2001-351386 | A | 12/2001 |
| JP | 2002-076356 | A | 3/2002 |
| JP | 2002-093924 | A | 3/2002 |
| JP | 2002-289859 | A | 10/2002 |
| JP | 2002-368226 | A | 12/2002 |
| JP | 2003-086000 | A | 3/2003 |
| JP | 2003-086808 | A | 3/2003 |
| JP | 2004-103957 | A | 4/2004 |
| JP | 2004-273614 | A | 9/2004 |
| JP | 2004-273732 | A | 9/2004 |
| JP | 2005-175494 | A | 6/2005 |
| JP | 2005-269616 | A | 9/2005 |
| JP | 2007-096055 | A | 4/2007 |
| JP | 2007-103918 | A | 4/2007 |
| JP | 2009-004787 | A | 1/2009 |
| JP | 2009-016844 | A | 1/2009 |
| JP | 2009-164393 | A | 7/2009 |
| JP | 2009-167087 | A | 7/2009 |
| JP | 2009-277702 | A | 11/2009 |
| JP | 2009-278115 | A | 11/2009 |
| JP | 2009-295997 | A | 12/2009 |
| JP | 2010-517292 | | 5/2010 |
| WO | 2004/114391 | A1 | 12/2004 |
| WO | 2007/029844 | A1 | 3/2007 |
| WO | WO-2008/091504 | | 7/2008 |
| WO | 2009/087943 | A1 | 7/2009 |
| WO | WO-2009/139482 | | 11/2009 |

OTHER PUBLICATIONS

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In—Ga—Zn—Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn—Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-

(56) References Cited

OTHER PUBLICATIONS

OLED Display," SID Digest '08 : SID International Symposium Digest of Technical Papers, May 20, 2008, vol. 39, pp. 629-632.

Park, J et al., "Amorphous Indium—Gallium—Zinc Oxide TFTs and Their Application for Large Size AMOLED," AM-FPD '08 Digest of Technical Papers, Jul. 2, 2008, pp. 275-278.

Park, S et al., "Challenge to Future Displays: Transparent AM-OLED Driven by Peald Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-in. AMOLED Display With Driver Circuit Using Amorphous In—Ga—Zn—Oxide TFTs," IDW '09 : Proceedings of the 16th International Display Workshops, 2009, pp. 689-692.

Son, K et al., "42.4L: Late-News Paper: 4 inch QVGA AMOLED Driven by the Threshold Voltage Controlled Amorphous GIZO (Ga2O3—In2O3—ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

Ishii, T et al.; "A Poly-Silicon TFT With a Sub-5-nm Thick Channel for Low-Power Gain Cell Memory in Mobile Applications"; IEEE Transactions on Electron Devices; Nov. 1, 2004; pp. 1805-1810; vol. 51, No. 11.

Kim, W et al., "An Experimental High-Density DRAM Cell with a Built-in Gain Stage," IEEE Journal of Solid-State Circuits, Aug. 1, 1994, vol. 29, No. 8, pp. 978-981.

Shukuri, S et al., "A Complementary Gain Cell Technology for Sub-1 V Supply DRAMs," IEDM 92: Technical Digest of International Electron Devices Meeting, Dec. 13, 1992, pp. 1006-1008.

Shukuri, S et al., "A Semi-Static Complementary Gain Cell Technology for Sub-1 V Supply DRAM's," IEEE Transactions on Electron Devices, Jun. 1, 1994, vol. 41, No. 6, pp. 926-931.

International Search Report (Application No. PCT/JP2010/071198) dated Feb. 8, 2011.

Written Opinion (Application No. PCT/JP2010/071198) dated Feb. 8, 2011.

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced At Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In—Ga—Zn—Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Hayashi, R et al., "42.1: Invited Paper: Improved Amorphous In—Ga—Zn—O TFTs," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTs) for AMLCDs," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda, T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-inch WXGA AMOLED Display Driven by Indium—Gallium—Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

(56) References Cited

OTHER PUBLICATIONS

Kimizuka, N et al., "Spinel,YbFe2O4, and Yb2Fe3O7 Types of Structures for Compounds in the In2O3 and Sc2O3-A2O3-Bo Systems [A; Fe, Ga, or Al; B: Mg, Mn, Fe, Ni, Cu,or Zn] at Temperatures Over 1000° C.," Journal of Solid State Chemistry, 1985, vol. 60, pp. 382-384.

Kimizuka, N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World's Largest (15-inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium—Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "SUFTLA Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3—Ga2ZnO4—ZnO system at 1350° C.," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.

Nowatari, H et al., "60.2: Intermediate Connector With Suppressed Voltage Loss for White Tandem OLEDs," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 in. QVGA AMOLED Display Using In—Ga—Zn—Oxide TFTs With a Novel Passivation Layer," SID Digest '09 : SID International Symposium Digest of Technical Papers, May 31, 2009, pp. 284-287.

Chinese Office Action (Application No. 201080057685.3) Dated Apr. 10, 2014.

Chinese Office Action (Application No. 201080057685.3) Dated Jun. 30, 2015.

\* cited by examiner

FIG. 3A1
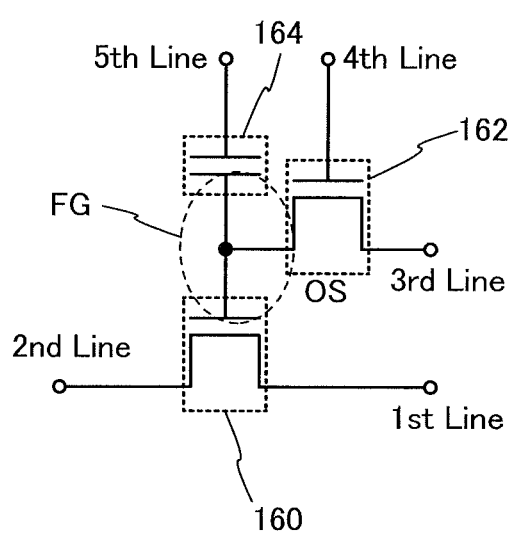
FIG. 3A2
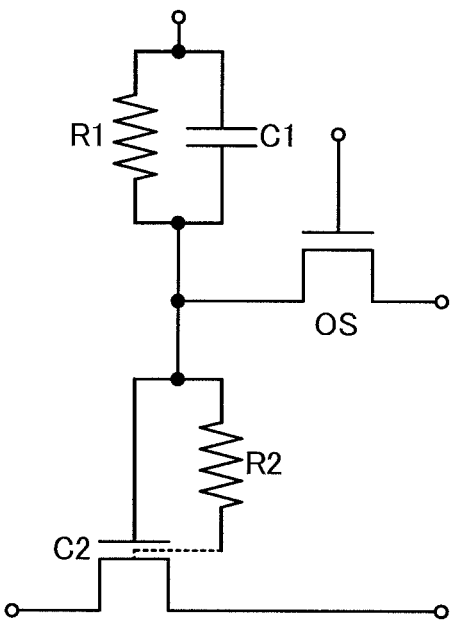
FIG. 3B
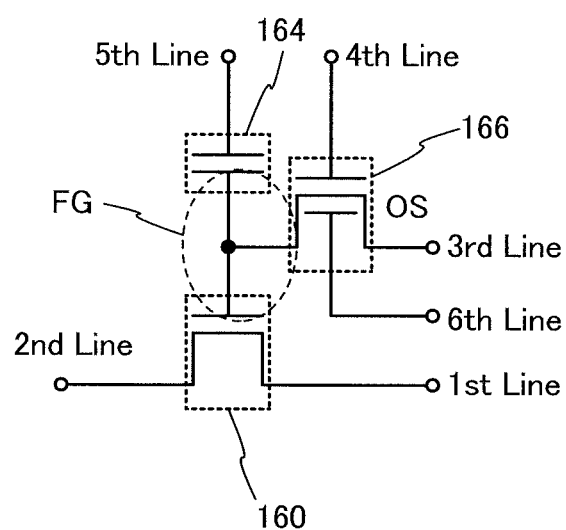

SEMICONDUCTOR DEVICE

CROSS-REFERENCE TO RELATED APPLICATIONS

This application is a continuation of U.S. application Ser. No. 12/966,611, filed Dec. 13, 2010, now allowed, which claims the benefit of foreign priority applications filed in Japan as Serial No. 2009-288474 on Dec. 18, 2009 and Serial No. 2009-294790 on Dec. 25, 2009 all of which are incorporated by reference.

TECHNICAL FIELD

The invention disclosed herein relates to a semiconductor device including a semiconductor element and a method for manufacturing the semiconductor device.

BACKGROUND ART

Storage devices using semiconductor elements are broadly classified into two categories: a volatile device that loses stored data when power supply stops, and a non-volatile device that retains stored data even when power is not supplied.

A typical example of a volatile storage device is a DRAM (dynamic random access memory). A DRAM stores data in such a manner that a transistor included in a storage element is selected and electric charge is stored in a capacitor.

When data is read from a DRAM, charge in a capacitor is lost on the above-described principle; thus, another writing operation is necessary every time data is read out. Moreover, a transistor included in a storage element has a leakage current and electric charge flows into or out of a capacitor even when the transistor is not selected, so that the data retention time is short. For that reason, another writing operation (refresh operation) is necessary at predetermined intervals, and it is difficult to sufficiently reduce power consumption. Furthermore, since stored data is lost when power supply stops, an additional storage device using a magnetic material or an optical material is needed in order to retain the data for a long time.

Another example of a volatile storage device is an SRAM (static random access memory). An SRAM retains stored data by using a circuit such as a flip-flop and thus does not need refresh operation. This means that an SRAM has an advantage over a DRAM. However, cost per storage capacity is increased because a circuit such as a flip-flop is used. Moreover, as in a DRAM, stored data in an SRAM is lost when power supply stops.

A typical example of a non-volatile storage device is a flash memory. A flash memory includes a floating gate between a gate electrode and a channel formation region in a transistor and stores data by retaining electric charge in the floating gate. Therefore, a flash memory has advantages in that the data retention time is extremely long (almost permanent) and refresh operation which is necessary in a volatile storage device is not needed (e.g., see Patent Document 1).

However, a gate insulating layer included in a storage element deteriorates by tunneling current generated in writing, so that the storage element stops its function after a predetermined number of writing operations. In order to reduce adverse effects of this problem, a method in which the numbers of writing operations for each storage element are equalized is employed, for example. However, a complicated peripheral circuit is needed to realize this method. Moreover, employing such a method does not solve the fundamental problem of lifetime. In other words, a flash memory is not suitable for applications in which data is frequently rewritten.

In addition, high voltage is necessary for retaining electric charge in the floating gate or removing the electric charge, and a circuit therefor is also needed. Further, it takes a relatively long time to retain or remove electric charge, and it is not easy to perform writing and erasing at higher speed.

REFERENCE

Patent Document

[Patent Document 1] Japanese Published Patent Application No. S57-105889

DISCLOSURE OF INVENTION

In view of the foregoing problems, an object of one embodiment of the invention disclosed is to provide a semiconductor device with a novel structure in which stored data can be retained even when power is not supplied, and there is no limitation on the number of times of writing.

In the invention disclosed, a semiconductor device is formed using a highly-purified oxide semiconductor. A transistor formed using a highly-purified oxide semiconductor can retain data for a long time because leakage current thereof is extremely small.

An embodiment of the disclosed invention is a semiconductor device comprising a first transistor including a channel formation region, impurity regions with the channel formation region provided therebetween, a first gate insulating layer provided over the channel formation region, a first gate electrode provided over the first gate insulating layer, and a first source electrode and a first drain electrode electrically connected to the impurity regions; a second transistor including an oxide semiconductor layer, a second source electrode and a second drain electrode electrically connected to the oxide semiconductor layer, a second gate insulating layer to cover the oxide semiconductor layer, the second source electrode, and the second drain electrode, and a second gate electrode to overlap with the oxide semiconductor layer over the second gate insulating layer; and a capacitor including one of the second source electrode and the second drain electrode, the second gate insulating layer, and an electrode provided to overlap with one of the second source electrode and the second drain electrode over the second gate insulating layer. The first gate electrode and one of the second source electrode and the second drain electrode are electrically connected to each other.

An embodiment of the disclosed invention is a semiconductor device comprising a first transistor including a channel formation region, impurity regions with the channel formation region provided therebetween, a first gate insulating layer provided over the channel formation region, a first gate electrode provided over the first gate insulating layer, and a first source electrode and a first drain electrode electrically connected to the impurity regions; a second transistor including an oxide semiconductor layer, a second source electrode and a second drain electrode electrically connected to the oxide semiconductor layer, an insulating layer in contact with the second source electrode and the second drain electrode, a second gate insulating layer provided to cover the oxide semiconductor layer, the second source electrode, the second drain electrode, and the insulating layer, and a second gate electrode provided to overlap with the oxide semiconductor layer over the second gate insulating layer; and a capacitor including one of the second source electrode and the second drain electrode, the second gate insulating layer, and an electrode provided to overlap with one of the second source electrode and the second drain electrode over the second gate insulating layer. The first gate electrode and one of the second source electrode and the second drain electrode are electrically connected to each other.

In the above description, the oxide semiconductor layer is preferably in contact with side surfaces or top surfaces of the second source electrode and the second drain electrode. In addition, in the above description, the second transistor and the capacitor are preferably provided above the first transistor.

Note that in this specification and the like, the term such as "over" or "below" does not necessarily mean that a component is placed "directly on" or "directly under" another component. For example, the expression "a gate electrode over a gate insulating layer" does not exclude the case where a component is placed between the gate insulating layer and the gate electrode. Moreover, the terms such as "over" and "below" are only used for convenience of description and can include the case where the relation of components is reversed, unless otherwise specified.

In addition, in this specification and the like, the term such as "electrode" or "wiring" does not limit a function of a component. For example, an "electrode" is sometimes used as part of a "wiring", and vice versa. Furthermore, the term "electrode" or "wiring" can include the case where a plurality of "electrodes" or "wirings" is formed in an integrated manner.

Functions of a "source" and a "drain" are sometimes replaced with each other when a transistor of opposite polarity is used or when the direction of current flowing is changed in circuit operation, for example. Therefore, the terms "source" and "drain" can be used to denote the drain and the source, respectively, in this specification.

Note that in this specification and the like, the term "electrically connected" includes the case where components are connected through an object having any electric function. There is no particular limitation on an object having any electric function as long as electric signals can be transmitted and received between components that are connected through the object.

Examples of an "object having any electric function" are a switching element such as a transistor, a resistor, an inductor, a capacitor, and an element with a variety of functions as well as an electrode and a wiring.

An embodiment of the present invention provides a semiconductor device having a structure in which a transistor including a material other than an oxide semiconductor and a transistor including an oxide semiconductor are stacked.

Since the off current of a transistor including an oxide semiconductor is extremely low, stored data can be retained for an extremely long time by using the transistor. In other words, power consumption can be adequately reduced because refresh operation becomes unnecessary or the frequency of refresh operation can be extremely low. Moreover, stored data can be retained for a long time even when power is not supplied.

Further, high voltage is not needed to write data, and deterioration of the element does not become a problem. For example, since there is no need to perform injection of electrons to a floating gate or extraction of electrons from the floating gate which is needed in a conventional nonvolatile memory, a problem such as deterioration of a gate insulating layer does not occur. That is, the semiconductor device according to one embodiment of the present invention does not have a limit on the number of times of writing which is a problem in a conventional nonvolatile memory, and reliability thereof is drastically improved. Furthermore, data is written depending on the on state and the off state of the transistor, whereby high-speed operation can be easily realized. In addition, there is no need of operation for erasing data.

Since a transistor including a material other than an oxide semiconductor can operate at sufficiently high speed, stored data can be read out at high speed by using the transistor.

A semiconductor device with a novel feature can be realized by including both the transistor including a material other than an oxide semiconductor and the transistor including an oxide semiconductor.

BRIEF DESCRIPTION OF DRAWINGS

In the accompanying drawings:
FIGS. 3A1 and 3A2 and FIG. 3B are circuit diagrams of semiconductor devices.

BEST MODE FOR CARRYING OUT THE INVENTION

Figure 1A:
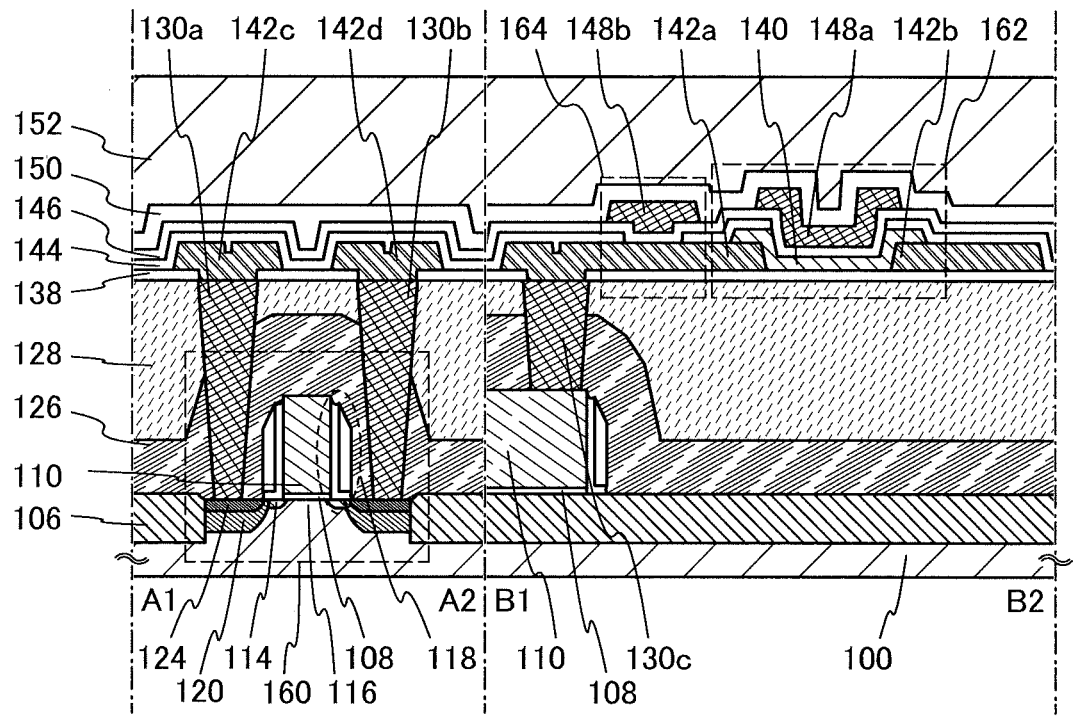
FIGS. 1A and 1B are a cross-sectional view and a plan view of a semiconductor device.

Hereinafter, the embodiments and example of the present invention will be described using the accompanying drawings. Note that the present invention is not limited to the following description and it will be readily appreciated by those skilled in the art that modes and details can be modified in various ways without departing from the spirit and the scope of the present invention. Therefore, the invention should not be construed as being limited to the description in the following embodiment modes.

Note that the position, the size, the range, or the like of each structure illustrated in drawings and the like is not accurately represented in some cases for easy understanding. Therefore, the disclosed invention is not necessarily limited to the position, size, range, or the like as disclosed in the drawings and the like.

In this specification and the like, ordinal numbers such as "first", "second", and "third" are used in order to avoid confusion among components, and the terms do not mean limitation of the number of components.

Embodiment 1

In this embodiment, a structure and a manufacturing method of a semiconductor device according to one embodiment of the invention disclosed is described with reference to FIGS. 1A and 1B, FIGS. 2A to 2D, FIGS. 3A1, A2, and 3B, FIGS. 4A to 4H, and FIGS. 5A to 5E. Note that in each of circuit diagrams, in some cases, "OS" is written beside a transistor in order to indicate that the transistor includes an oxide semiconductor.

<Planar Structure and Cross-Sectional Structure of Semiconductor Device>

Figure 1B:
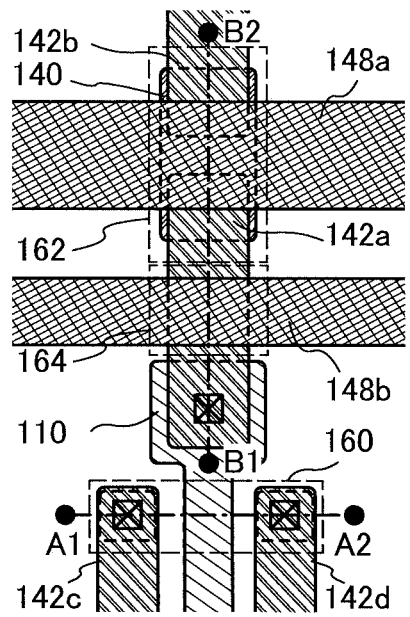

FIGS. 1A and 1B illustrate an example of a structure of the semiconductor device. FIG. 1A illustrates a cross section of the semiconductor device, and FIG. 1B illustrates a plan view of the semiconductor device. Here, FIG. 1A corresponds to a cross section taken along lines A1-A2 and B1-B2 of FIG. 1B. In the semiconductor device illustrated in FIGS. 1A and 1B, a transistor 160 including a material other than an oxide semiconductor is provided in a lower portion, and a transistor 162 including an oxide semiconductor and a capacitor 164 are provided in an upper portion. Although the transistor 160 and the transistor 162 are n-channel transistors here, it is needless to say that p-channel transistors can be used. Since the technical nature of the disclosed invention is to use an oxide semiconductor in the transistor 162 so that data can be retained, it is not necessary to limit a specific structure of a semiconductor device to the structure described here.

The transistor 160 includes a channel formation region 116 provided in a substrate 100 containing a semiconductor material (e.g., silicon), impurity regions 114 and high-concentration impurity regions 120 (the impurity regions 114 and the high-concentration impurity regions 120 are also collectively referred to as impurity regions) with the channel formation region 116 provided therebetween, a gate insulating layer 108 provided over the channel formation region 116, a gate electrode 110 provided over the gate insulating layer 108, and a source or drain electrode 130a and a source or drain electrode 130b which are electrically connected to the impurity regions.

Here, sidewall insulating layers 118 are provided on side surfaces of the gate electrode 110. Moreover, the high-concentration impurity regions 120 are formed in the semiconductor substrate 100 so as not to overlap with the sidewall insulating layers 118, when seen from above, and metal compound regions 124 are provided in contact with the high-concentration impurity regions 120. An element isolation insulating layer 106 is provided over the substrate 100 so as to surround the transistor 160. An interlayer insulating layer 126 and an interlayer insulating layer 128 are provided so as to cover the transistor 160. The source or drain electrode 130a and the source or drain electrode 130b are electrically connected to the metal compound regions 124 through openings formed in the interlayer insulating layers 126 and 128. That is, each of the source or drain electrode 130a and the source or drain electrode 130b is electrically connected to the high-concentration impurity region 120 and the impurity region 114 through the metal compound region 124. In addition, an electrode 130c is electrically connected to the gate electrode 110 through an opening formed in the interlayer insulating layers 126 and 128. Note that the sidewall insulating layers 118 are not formed in some cases, for integration of the transistor 160.

The transistor 162 includes a source or drain electrode 142a and a source or drain electrode 142b which are provided over an insulating layer 138; an oxide semiconductor layer 140 electrically connected to the source or drain electrode 142a and the source or drain electrode 142b; an insulating layer 144 in contact with the source or drain electrode 142a, the source or drain electrode 142b, and the oxide semiconductor layer 140; a gate insulating layer 146 covering the source or drain electrode 142a, the source or drain electrode 142b, the oxide semiconductor layer 140, and the insulating layer 144; and a gate electrode 148a provided so as to overlap with the oxide semiconductor layer 140 over the gate insulating layer 146. Here, the insulating layer 144 is provided so that capacitance caused by the gate electrode 148a and the like is reduced. Note that in order to simplify process, a structure in which the insulating layer 144 is not provided can be employed.

As described above, the transistor 162 illustrated in FIGS. 1A and 1B is a top-gate transistor, and can be referred to as a top-gate bottom-contact transistor because the oxide semiconductor layer 140 and the source or drain electrode 142a or the like are connected in a region including a bottom surface of the oxide semiconductor layer 140.

Here, the oxide semiconductor layer 140 is preferably an oxide semiconductor layer which is highly purified by sufficiently removing an impurity such as hydrogen therefrom or sufficiently supplying oxygen thereto. Specifically, for example, the hydrogen concentration of the oxide semiconductor layer 140 is less than or equal to $5 \times 10^{19}$ atoms/cm$^3$, preferably less than or equal to $5 \times 10^{18}$ atoms/cm$^3$, and more preferably less than or equal to $5 \times 10^{17}$ atoms/cm$^3$. Note that the above hydrogen concentration of the oxide semiconductor layer 140 is measured by secondary ion mass spectrometry (SIMS). A carrier concentration which is less than $1 \times 10^{12}$/cm$^3$, preferably less than $1 \times 10^{11}$/cm$^3$, and more preferably less than $1.45 \times 10^{10}$/cm$^3$ is obtained in the oxide semiconductor layer 140 which is highly purified by sufficiently reducing the hydrogen concentration in such a manner and in which defect levels in an energy gap caused by oxygen deficiency are reduced by sufficient supply of oxygen. For example, in the case where a channel length is 10 μm and the thickness of the oxide semiconductor layer is 30 nm, when a drain voltage ranges from approximately 1 V to 10 V, off current (a drain current when a gate-source voltage is less than or equal to 0 V) is less than or equal to $1 \times 10^{-13}$ A. Further, off current density (a value obtained by dividing the off current by a channel width of the transistor) at room temperature is approximately $1 \times 10^{-20}$ A/m (10 zA/m) to $1 \times 10^{-19}$ A/m (100 zA/m). In addition, off resistivity is greater than or equal to $1 \times 10^9$ Ω·m, and preferably greater than or equal to $1 \times 10^{10}$ Ω·m. In this manner, when such an oxide semiconductor which is made to be i-type (intrinsic) or substantially i-type is used, the transistor 162 having excellent off-current characteristic can be obtained.

The source or drain electrode 142a is electrically connected to the electrode 130c. In other words, the source or drain electrode 142a is electrically connected to the gate electrode 110 of the transistor 160. In a similar manner, an electrode 142c and an electrode 142d are provided in contact with the source or drain electrode 130a and the source or drain electrode 130b, respectively.

The capacitor 164 is formed with the source or drain electrode 142a, the gate insulating layer 146, and an electrode 148b. That is to say, the source or drain electrode 142a functions as one of electrodes of the capacitor 164, and the electrode 148b functions as the other electrode of the capacitor 164.

A protective insulating layer 150 is provided over the transistor 162 and the capacitor 164, and an interlayer insulating layer 152 is provided over the protective insulating layer 150.

<Modified Examples of Transistor and Capacitor in Upper Portion>

Next, modified examples of the transistor and the capacitor in the upper portion in FIG. 1A are illustrated in FIGS. 2A to 2D.

Figure 2A:
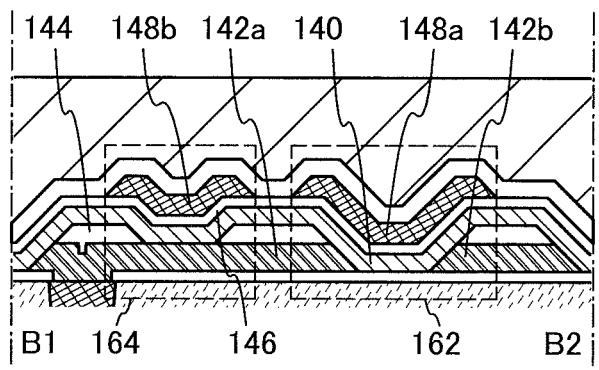
FIGS. 2A to 2D are cross-sectional views of a semiconductor device.

A transistor and a capacitor illustrated in FIG. 2A is a modified example of the transistor and the capacitor in the upper portion of the semiconductor device illustrated in FIGS. 1A and 1B.

The structure illustrated in FIG. 2A is different from the structure illustrated in FIG. 1A in that the insulating layer 144 is provided over the source or drain electrode 142a and the source or drain electrode 142b, and the oxide semiconductor layer 140 covers the insulating layer 144, the source or drain electrode 142a, and the source or drain electrode 142b. In addition, the oxide semiconductor layer 140 is provided in contact with the source or drain electrode 142a through an opening provided in the insulating layer 144.

Further, in the transistors and the capacitors illustrated in FIGS. 2A to 2D, edge portions of the source or drain electrode 142a, the source or drain electrode 142b, and the insulating layer 144 preferably have tapered shapes. Here, a taper angle is, for example, preferably greater than or equal to 30° and less than or equal to 60°. Note that the taper angle refers to an inclination angle formed with a side surface and a bottom surface of a layer having a tapered shape (for example, the source or drain electrode 142a) when seen from a direction perpendicular to a cross section (a plane perpendicular to a surface of a substrate) of the layer. When the edge portions of the source or drain electrode 142a and the source or drain electrode 142b have tapered shapes, coverage with the oxide semiconductor layer 140 can be improved and disconnection due to a step can be prevented.

In the structure illustrated in FIG. 2A, since the oxide semiconductor layer 140 is not processed, mixing of a contaminant to the oxide semiconductor layer 140 due to etching performed in processing can be avoided. Further, in the capacitor 164, when the oxide semiconductor layer 140 and the gate insulating layer 146 are stacked, insulation between the source or drain electrode 142a and the electrode 148b can be ensured sufficiently.

Figure 2B:
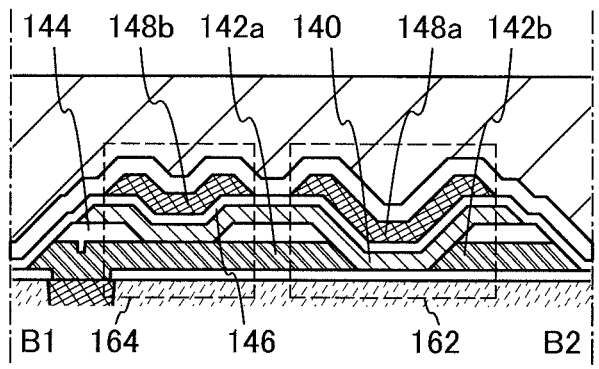

A transistor and a capacitor illustrated in FIG. 2B have a structure partly different from that of the transistor and the capacitor of FIG. 2A.

The structure illustrated in FIG. 2B is different from the structure illustrated in FIG. 2A in that an oxide semiconductor is formed to have an island shape. In other words, the oxide semiconductor layer 140 covers the insulating layer 144, the source or drain electrode 142a, and the source or drain electrode 142b as a whole in the structure in FIG. 2A, whereas in the structure in FIG. 2B, the oxide semiconductor layer has an island shape, whereby the oxide semiconductor layer covers part of the insulating layer 144, the source or drain electrode 142a, and the source or drain electrode 142b. Here, an edge portion of the island-shaped oxide semiconductor layer 140 preferably has a tapered shape. The taper angle thereof is, for example, preferably greater than or equal to 30° and less than or equal to 60°.

Further, in the capacitor 164, when the oxide semiconductor layer 140 and the gate insulating layer 146 are stacked, insulation between the source or drain electrode 142a and the electrode 148b can be ensured sufficiently.

Figure 2C:
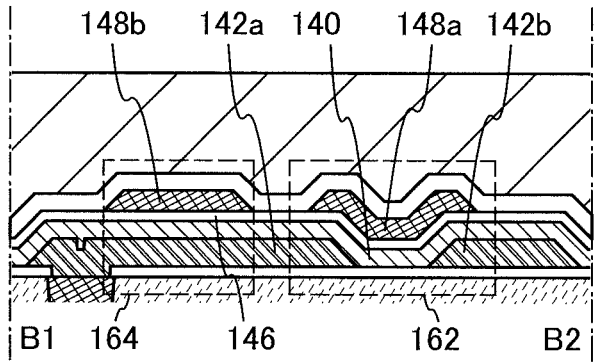

A transistor and a capacitor illustrated in FIG. 2C have a structure partly different from that of the transistor and the capacitor of FIG. 2A.

The structure in FIG. 2C is different from the structure illustrated in FIG. 2A in that the insulating layer 144 is not provided in the transistor 162 and the capacitor 164. Since the insulating layer 144 is not provided in the structure illustrated in FIG. 2C, the manufacturing process is simplified and the manufacturing cost is reduced as compared to the transistor and the capacitor illustrated in FIG. 2A.

In the structure illustrated in FIG. 2C, since the oxide semiconductor layer 140 is not processed, mixing of a contaminant to the oxide semiconductor layer 140 due to etching performed in processing can be avoided. Further, in the capacitor 164, when the oxide semiconductor layer 140 and the gate insulating layer 146 are stacked, insulation between the source or drain electrode 142a and the electrode 148b can be ensured sufficiently.

Figure 2D:
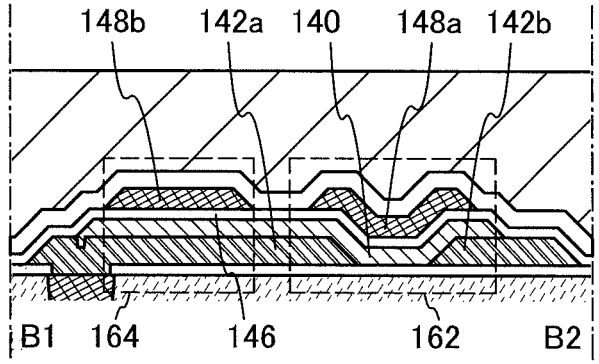

A transistor and a capacitor illustrated in FIG. 2D have a structure partly different from that of the transistor and the capacitor of FIG. 2B.

The structure of FIG. 2D is different from the structure illustrated in FIG. 2B in that the insulating layer 144 is not provided in the transistor 162 and the capacitor 164. When the insulating layer 144 is not provided in the transistor 162 and the capacitor 164, manufacturing process is simplified and manufacturing cost is reduced as compared to the case of FIG. 2B.

Further, in the capacitor 164, when the oxide semiconductor layer 140 and the gate insulating layer 146 are stacked, insulation between the source or drain electrode 142a and the electrode 148b can be ensured sufficiently.

<Circuit Configuration and Operation of Semiconductor Device>

Next, examples of a circuit configuration of the semiconductor device and operation thereof are described. FIG. 3A1 illustrates an example of a circuit configuration corresponding to the semiconductor device illustrated in FIGS. 1A and 1B.

In the semiconductor device illustrated in FIG. 3A1, a first wiring (a 1st line, also referred to as a source line) is electrically connected to a source electrode of the transistor 160. A second wiring (a 2nd line, also referred to as a bit line) is electrically connected to a drain electrode of the transistor 160. Further, a third wiring (a 3rd line, also referred to as a first signal line) is electrically connected to the other of the source electrode and the drain electrode of the transistor 162, and a fourth wiring (a 4th line, also referred to as a second signal line) is electrically connected to a gate electrode of the transistor 162. Furthermore, the gate electrode of the transistor 160 and one of the source electrode and the drain electrode of the transistor 162 are electrically connected to one of the electrodes of the capacitor 164. A fifth wiring (a 5th line, also referred to as a word line) is electrically connected to the other electrode of the capacitor 164.

Since the transistor 160 including a material other than an oxide semiconductor can operate at sufficiently high speed, stored data can be read out at high speed by using the transistor 160. Moreover, the transistor 162 including an oxide semiconductor has extremely low off current. For that reason, a potential of the gate electrode of the transistor 160 can be retained for an extremely long time by turning off the transistor 162. By providing the capacitor 164, retention of charge given to the gate electrode of the transistor 160 and reading of stored data can be performed easily.

The semiconductor device in this embodiment makes use of a characteristic in which the potential of the gate electrode of the transistor 160 can be retained, thereby writing, retention, and reading data as follows.

Firstly, writing and retention of data are described. First, the potential of the fourth wiring is set to a potential at which the transistor 162 is turned on, so that the transistor 162 is turned on. Accordingly, the potential of the third wiring is supplied to the gate electrode of the transistor 160 and one of the electrodes of the capacitor 164. That is, predetermined charge is given to the gate electrode of the transistor 160 (writing). Here, any of two charges giving different potential levels (hereinafter also referred to as a low-level charge and a high-level charge) is given. After that, the potential of the fourth wiring is set to a potential at which the transistor 162 is turned off, so that the transistor 162 is turned off. Thus, the charge given to the gate electrode of the transistor 160 is retained (retention).

Since the off current of the transistor 162 is significantly small, the charge of the gate electrode of the transistor 160 is retained for a long time.

Secondly, reading of data will be described. By supplying an appropriate potential (reading potential) to the fifth wiring while a predetermined potential (constant potential) is supplied to the first wiring, the potential of the second wiring varies depending on the amount of charge retained in the gate electrode of the transistor 160. This is because in general, when the transistor 160 is an n-channel transistor, an apparent threshold voltage $V_{th\_H}$ in the case where a high-level charge is given to the gate electrode of the transistor 160 is lower than an apparent threshold voltage $V_{th\_L}$ in the case where a low-level charge is given to the gate electrode of the transistor 160. Here, an apparent threshold voltage refers to the potential of the fifth wiring, which is needed to turn on the transistor 160. Thus, the potential of the fifth wiring is set to a potential $V_0$ intermediate between $V_{th\_H}$ and $V_{th\_L}$, whereby charge given to the gate electrode of the transistor 160 can be determined. For example, in the case where a high-level charge is given in writing, when the potential of the fifth wiring is set to $V_0$ ($>V_{th\_H}$), the transistor 160 is turned on. In the case where a low level charge is given in writing, even when the potential of the fifth wiring is set to $V_0$ ($<V_{th\_L}$), the transistor 160 remains in an off state. Therefore, the stored data can be read by the potential of the second line Note that in the case data is not read out, a potential at which the transistor 160 is turned off, that is, a potential smaller than $V_{th\_H}$ may be given to the fifth wiring regardless of the state of the gate electrode of the transistor 160. Alternatively, a potential at which the transistor 160 is turned on, that is, a potential higher than $V_{th\_L}$, may be given to the fifth wiring regardless of the state of the gate electrode of the transistor 160.

Thirdly, rewriting of data will be described. Rewriting of data is performed in a manner similar to that of the writing and retention of data. That is, the potential of the fourth wiring is set to a potential which at which the transistor 162 is turned on, whereby the transistor 162 is turned on. Accordingly, the potential of the third wiring (potential related to new data) is supplied to the gate electrode of the transistor 160 and one of the electrodes of the capacitor 164. After that, the potential of the fourth wiring is set to a potential at which the transistor 162 is turned off, whereby the transistor 162 is turned off. Accordingly, charge related to new data is given to the gate electrode of the transistor 160.

In the semiconductor device according to the invention disclosed herein, data can be directly rewritten by another writing of data as described above. For that reason, erasing operation which is necessary for a flash memory or the like is not needed, so that a reduction in operation speed because of erasing operation can be prevented. In other words, high-speed operation of the semiconductor device can be realized.

Note that the source electrode or the drain electrode of the transistor 162 is electrically connected to the gate electrode of the transistor 160, thereby having an effect similar to that of a floating gate of a floating gate transistor used for a nonvolatile memory element. Therefore, a portion in the drawing where the source electrode or the drain electrode of the transistor 162 is electrically connected to the gate electrode of the transistor 160 is called a floating gate portion FG in some cases. When the transistor 162 is off, the floating gate portion FG can be regarded as being embedded in an insulator and thus charge is retained in the floating gate portion FG. The amount of off current in the transistor 162 including an oxide semiconductor is smaller than or equal to one hundred thousandth of the amount of off current of the transistor 160 including a silicon semiconductor or the like; thus, lost of the charge accumulated in the floating gate portion FG due to a leakage current of the transistor 162 is negligible. That is, with the transistor 162 including an oxide semiconductor, a nonvolatile memory device can be realized.

For example, when the off current density of the transistor 162 is approximately 10 zA/m (1 zA (zeptoampere) is $1\times10^{-21}$ A) at room temperature and the capacitance value of the capacitor 164 is approximately 1 pF, data can be retained for $10^6$ seconds or longer. It is needless to say that the retention time depends on transistor characteristics and the capacitance value.

Further, in this case, the problem of deterioration of a gate insulating film (tunnel insulating film), which is pointed out in a conventional floating gate transistor, can be avoided. That is to say, the problem of deterioration of a gate insulating film due to injection of an electron into a floating gate can be solved. Accordingly, in the semiconductor device described in this embodiment, there is no limit on the number of times of writing in principle. Furthermore, high voltage needed for writing or erasing in a conventional floating gate transistor is not necessary.

The components such as transistors in the semiconductor device in FIG. 3A1 can be regarded as being formed with a resistor and a capacitor and replaced with such a circuit illustrated in FIG. 3A2. That is, in FIG. 3A2, the transistor 160 and the capacitor 164 are each regarded as including a resistor and a capacitor. R1 and C1 denote the resistance value and the capacitance value of the capacitor 164, respectively. The resistance value R1 corresponds to the resistance value which depends on an insulating layer included in the capacitor 164. R2 and C2 denote the resistance value and the capacitance value of the transistor 160, respectively. The resistance value R2 corresponds to a resistance value which depends on a gate insulating layer at the time when the transistor 160 is in an on state. The capacitance value C2 corresponds to the value of a so-called gate capacitor (a capacitor formed between the gate electrode and the source electrode or the drain electrode). Note that since the resistance value R2 only denotes the resistance value between the gate electrode and the channel formation region of the transistor 160, in order to clarify this point, part of connection is denoted by a dotted line.

Assuming that the resistance value (also referred to as effective resistance) between the source electrode and the drain electrode in the case where the transistor 162 is in an off state is ROS, when R1≥ROS and R2≥ROS are satisfied, an electron retention period (also referred to as a data retention period) is determined mainly by an off current of the transistor 162.

On the other hand, when the condition is not satisfied, it is difficult to sufficiently ensure the retention period even if the off current of the transistor 162 is small enough. This is because leakage current other than the leakage current occurred in the transistor 162 is large. Thus, it can be said that the semiconductor device disclosed in this embodiment desirably secures the above relation.

Meanwhile, it is desirable that C1≥C2 be satisfied. This is because if C1 is large, the potential of the fifth wiring can be suppressed so as to be low when the potential of the floating gate portion FG is controlled by the fifth wiring (e.g., at the time of reading).

When the above relation is secured, a more preferable semiconductor device can be realized. In this embodiment, R1 and R2 are controlled by the gate insulating layer 108, the gate insulating layer 146, or the like. The same applies to C1 and C2. Therefore, the material, the thickness, and the like of the gate insulating layer are desirably set as appropriate to secure the above relation.

FIG. 3B illustrates a semiconductor device which is partly different from the above semiconductor device. In the semiconductor illustrated in FIG. 3B, a gate electrode of the transistor 160, one of a source electrode and a drain electrode of a transistor 166, and one of electrodes of the capacitor 164 are electrically connected to one another. The first wiring and the source electrode of the transistor 160 are electrically connected to each other. The second wiring and the drain electrode of the transistor 160 are electrically connected to each other. The third wiring and the other of the source electrode and the drain electrode of the transistor 166 are electrically connected to each other. The fourth wiring and a first gate electrode of the transistor 166 are electrically connected to each other. The fifth wiring and the other electrode of the capacitor 164 are electrically connected to each other. A sixth wiring and a second gate electrode of the transistor 166 are electrically connected to each other. A potential which is the same as that applied to the fourth wiring may be applied to the sixth wiring. Alternatively, a potential which is different from that applied to the fourth wiring may be applied to the sixth wiring so as to be controlled independently of the fourth wiring.

In other words, the semiconductor device illustrated in FIG. 3B has a structure in which the transistor 162 of the semiconductor device in FIG. 3A1 is replaced with the transistor 166, which has the second gate electrode. Accordingly, in the semiconductor device in FIG. 3B, an effect of easily controlling electrical characteristics (e.g., a threshold voltage) of the transistor 166 can be obtained in addition to the effect obtained in the semiconductor device in FIG. 3A1. For example, when a negative potential is applied to the sixth wiring, the transistor 166 can be made to be a normally-off transistor easily.

Note that an n-channel transistor in which electrons are majority carriers is used in the above description; it is needless to say that a p-channel transistor in which holes are majority carriers can be used instead of the n-channel transistor.

<Method for Manufacturing Semiconductor Device>

Next, an example of a method for manufacturing a semiconductor device illustrated in FIGS. 1A and 1B and FIG. 3A1 will be described hereinafter. First, a method for manufacturing the transistor 160 in the lower portion will be described below with reference to FIGS. 4A to 4H, and then a method for manufacturing the transistor 162 and the capacitor 164 in the upper portion will be described with reference to FIGS. 5A to 5E.

<Method for Manufacturing Transistor in Lower Portion>

Figure 4A:
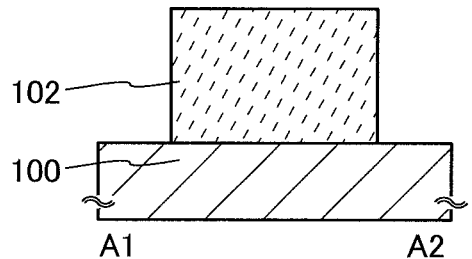
FIGS. 4A to 4H are cross-sectional views relating to manufacturing steps of a semiconductor device.

First, the substrate 100 including a semiconductor material is prepared (see FIG. 4A). As the substrate 100 including a semiconductor material, a single crystal semiconductor substrate or a polycrystalline semiconductor substrate made of silicon, silicon carbide, or the like; a compound semiconductor substrate made of silicon germanium or the like; an SOI substrate; or the like can be used. Here, an example of using a single crystal silicon substrate as the substrate 100 including a semiconductor material is described. Note that in general, the term "SOI substrate" means a substrate where a silicon semiconductor layer is provided on an insulating surface. In this specification and the like, the term "SOI substrate" also includes a substrate where a semiconductor layer formed using a material other than silicon is provided over an insulating surface in its category. That is, a semiconductor layer included in the "SOI substrate" is not limited to a silicon semiconductor layer. Moreover, the SOI substrate can be a substrate having a structure in which a semiconductor layer is provided over an insulating substrate such as a glass substrate, with an insulating layer provided therebetween.

A protective layer 102 serving as a mask for forming an element isolation insulating layer is formed over the substrate 100 (see FIG. 4A). As the protective layer 102, an insulating layer formed using silicon oxide, silicon nitride, silicon nitride oxide, or the like can be used, for example. Note that before or after this step, an impurity element imparting n-type conductivity or an impurity element imparting p-type conductivity may be added to the substrate 100 in order to control the threshold voltage of the transistor. When the semiconductor is formed using silicon, phosphorus, arsenic, or the like can be used as the impurity imparting n-type conductivity. Boron, aluminum, gallium, or the like can be used as the impurity imparting p-type conductivity.

Next, part of the substrate 100 in a region which is not covered with the protective layer 102 (exposed region) is etched with use of the protective layer 102 as a mask. Thus, an isolated semiconductor region 104 is formed (see FIG. 4B). As the etching, dry etching is preferably performed, but wet etching can be performed. An etching gas and an etchant can be selected as appropriate depending on a material of layers to be etched.

Figure 4B:
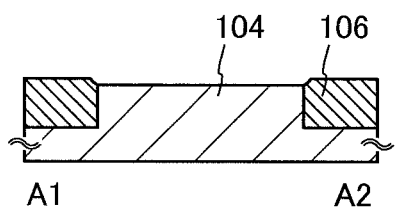

Then, an insulating layer is formed to cover the semiconductor region 104, and the insulating layer in a region overlapping with the semiconductor region 104 is selectively removed, so that element isolation insulating layers 106 are formed (see FIG. 4B). The insulating layer is formed using silicon oxide, silicon nitride, silicon nitride oxide, or the like. As a method for removing the insulating layer, any of etching treatment and polishing treatment such as CMP can be employed. Note that the protective layer 102 is removed after formation of the semiconductor region 104 or after formation of the element isolation insulating layers 106.

Next, an insulating layer is formed over the semiconductor region 104, and a layer including a conductive material is formed over the insulating layer.

The insulating layer serves later as a gate insulating layer, and is formed by CVD method, a sputtering method, or the like to be a single layer of a silicon oxide film, a silicon nitride oxide film, a silicon nitride film, a hafnium oxide film, an aluminum oxide film, a tantalum oxide film, or the like or a stacked layer including any of the above films. Alternatively, the insulating layer may be formed in such a manner that a surface of the semiconductor region 104 is oxidized or nitrided by high-density plasma treatment or thermal oxidation treatment. The high-density plasma treatment can be performed using, for example, a mixed gas of a rare gas such as He, Ar, Kr, or Xe and a gas such as oxygen, nitrogen oxide, ammonia, nitrogen, or hydrogen. There is no particular limitation on the thickness of the insulating layer, but the insulating layer can be formed in the range of greater than or equal to 1 nm and less than or equal to 100 nm, for example.

The layer including a conductive material can be formed using a metal material such as aluminum, copper, titanium, tantalum, or tungsten. The layer including a conductive material may be formed using a semiconductor material such as polycrystalline silicon. There is no particular limitation on the method for forming the layer containing a conductive material, and a variety of deposition methods such as an evaporation method, a CVD method, a sputtering method, or a spin coating method can be employed. Note that this embodiment describes an example of the case where the layer containing a conductive material is formed using a metal material.

Figure 4C:
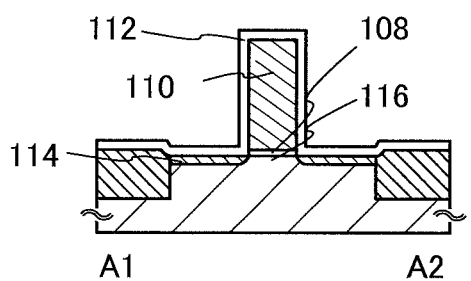

After that, by selectively etching the insulating layer and the layer containing a conductive material, the gate insulating layer 108 and the gate electrode 110 are formed (see FIG. 4C).

Next, an insulating layer 112 that covers the gate electrode 110 is formed (see FIG. 4C). Phosphorus (P), arsenic (As), or the like is then added to the semiconductor region 104, whereby the impurity regions 114 with a shallow junction depth are formed (see FIG. 4C). Note that phosphorus or arsenic is added here in order to form an n-channel transistor; an impurity element such as boron (B) or aluminum (Al) may be added in the case of forming a p-channel transistor. With formation of the impurity regions 114, the channel formation region 116 is formed in the semiconductor region 104 below the gate insulating layer 108 (see FIG. 4C). Here, the concentration of the impurity added can be set as appropriate; the concentration is preferably increased when the size of a semiconductor element is extremely decreased. The step in which the impurity regions 114 are formed after the formation of the insulating layer 112 is employed here; alternatively, the insulating layer 112 may be formed after the formation of the impurity regions 114.

Figure 4D:
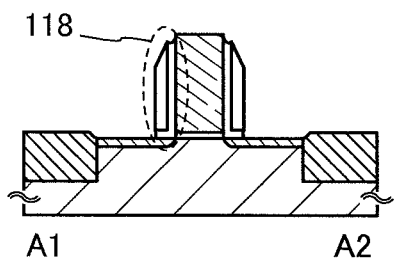
Figure 4E:
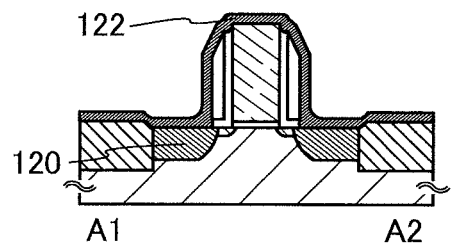
Figure 4F:
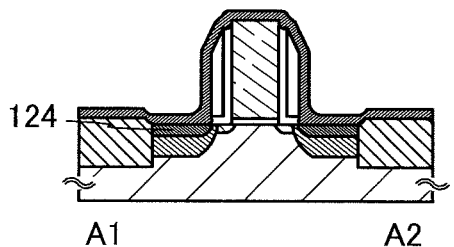

Next, the sidewall insulating layers 118 are formed (see FIG. 4D). An insulating layer is formed so as to cover the insulating layer 112 and then subjected to highly anisotropic etching, whereby the sidewall insulating layers 118 can be formed in a self-aligned manner. At this time, it is preferable to partly etch the insulating layer 112 so that a top surface of the gate electrode 110 and top surfaces of the impurity regions 114 are exposed.

Then, an insulating layer is formed so as to cover the gate electrode 110, the impurity regions 114, the sidewall insulating layers 118, and the like. Phosphorus (P), arsenic (As), or the like is then added to regions of the impurity regions 114 which are in contact with the insulating layer, whereby the high-concentration impurity regions 120 are formed (see FIG. 4E). After that, the insulating layer is removed, and a metal layer 122 is formed so as to cover the gate electrode 110, the sidewall insulating layers 118, the high-concentration impurity regions 120, and the like (see FIG. 4E). A variety of deposition methods such as a vacuum evaporation method, a sputtering method, or a spin coating method can be employed for forming the metal layer 122. The metal layer 122 is preferably formed using a metal material that reacts with a semiconductor material included in the semiconductor region 104 to be a low-resistance metal compound. Examples of such metal materials include titanium, tantalum, tungsten, nickel, cobalt, and platinum.

Next, heat treatment is performed so that the metal layer 122 reacts with the semiconductor material. Thus, the metal compound regions 124 that are in contact with the high-concentration impurity regions 120 are formed (see FIG. 4F). Note that when the gate electrode 110 is formed using polycrystalline silicon or the like, a metal compound region is also formed in a region of the gate electrode 110 in contact with the metal layer 122.

As the heat treatment, irradiation with a flash lamp can be employed, for example. Although it is needless to say that another heat treatment method may be used, a method by which heat treatment for an extremely short time can be achieved is preferably used in order to improve the controllability of chemical reaction in formation of the metal compound. Note that the metal compound regions are formed by reaction of the metal material and the semiconductor material and have sufficiently high conductivity. The formation of the metal compound regions can properly reduce the electric resistance and improve element characteristics. Note that the metal layer 122 is removed after the metal compound regions 124 are formed.

Figure 4G:
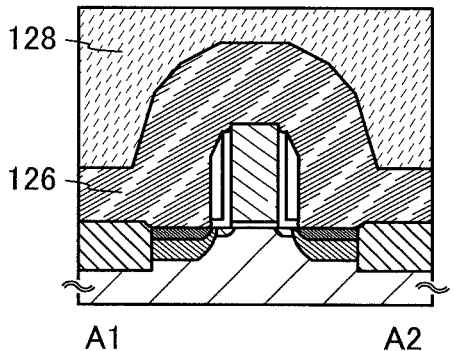

Then, the interlayer insulating layer 126 and the interlayer insulating layer 128 are formed to cover the components formed in the above steps (see FIG. 4G). The interlayer insulating layers 126 and 128 can be formed using an inorganic insulating material such as silicon oxide, silicon nitride oxide, silicon nitride, hafnium oxide, aluminum oxide, or tantalum oxide. Moreover, the interlayer insulating layers 126 and 128 can be formed using an organic insulating material such as polyimide or acrylic resin. Although the interlayer insulating layer here has a structure including two layers of the interlayer insulating layer 126 and the interlayer insulating layer 128, the structure of the interlayer insulating layer is not limited thereto. After formation of the interlayer insulating layer 128, a surface of the interlayer insulating layer 128 is preferably planarized with CMP, etching, or the like.

Figure 4H:
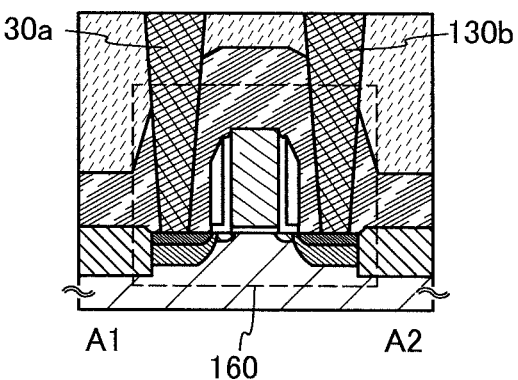

Then, openings that reach the metal compound regions 124 are formed in the interlayer insulating layers, and the source or drain electrode 130a and the source or drain electrode 130b are formed in the openings (see FIG. 4H). The source or drain electrode 130a and the source or drain electrode 130b can be formed in such a manner, for example, that a conductive layer is formed in a region including the openings by a PVD method, a CVD method, or the like and then part of the conductive layer is removed by etching, CMP, or the like.

Specifically, it is possible to employ a method, for example, in which a thin titanium film is formed in a region including the openings by a PVD method and a thin titanium nitride film is formed by a CVD method, and then, a tungsten film is formed so as to be embedded in the openings. Here, the titanium film formed by a PVD method has a function of reducing a surface of an oxide film (e.g., a native oxide film), over which the titanium film is formed, to decrease the contact resistance with the lower electrodes (e.g., the metal compound region 124, here). The titanium nitride film formed after the formation of the titanium film has a barrier function of preventing diffusion of the conductive material. A copper film may be formed by a plating method after the formation of the barrier film of titanium, titanium nitride, or the like.

Note that in the case where the source or drain electrode 130a and the source or drain electrode 130b are formed by removing part of the conductive layer, the process is preferably performed so that the surfaces are planarized. For example, when a thin titanium film or a thin titanium nitride film is formed in a region including the openings and then a tungsten film is formed so as to be embedded in the openings, excess tungsten, titanium, titanium nitride, or the like is removed and the planarity of the surface can be improved by subsequent CMP. The surface including the source or drain electrode 130a and the source or drain electrode 130b is planarized in such a manner, so that an electrode, a wiring, an insulating layer, a semiconductor layer, and the like can be favorably formed in later steps.

Note that only the source or drain electrode 130a and the source or drain electrode 130b in contact with the metal compound regions 124 are shown here; however, the electrode 130c that is in contact with the gate electrode 110 and the like can also be formed in this step. There is no particular limitation on a material used for the source or drain electrode 130a and the source or drain electrode 130b, and a variety of conductive materials can be used. For example, a conductive material such as molybdenum, titanium, chromium, tantalum, tungsten, aluminum, copper, neodymium, or scandium can be used. In consideration of heat treatment performed later, the source or drain electrode 130a and the source or drain electrode 130b are preferably formed using a material which has heat resistance high enough to withstand the heat treatment performed later.

In this manner, the transistor 160 using the substrate 100 including a semiconductor material is formed (see FIG. 4H). Note that an electrode, a wiring, an insulating layer, or the like may be further formed after the above step. When the wirings have a stacked-layer structure of a layered structure including an interlayer insulating layer and a conductive layer, a highly integrated semiconductor device can be provided.

<Method for Manufacturing Transistor in Upper Portion>

Next, steps for manufacturing the transistor 162 over the interlayer insulating layer 128 will be described with reference to FIGS. 5A to 5E. Note that FIGS. 5A to 5E illustrate steps for manufacturing electrodes, the transistor 162, and the like over the interlayer insulating layer 128; therefore, details of the transistor 160 and the like placed below the transistor 162 are omitted.

First, an insulating layer 138 is formed over the interlayer insulating layer 128, the source or drain electrode 130a, the source or drain electrode 130b, and the electrode 130c. The insulating layer 138 can be formed by a PVD method, a CVD method, or the like. The insulating layer 138 can be formed using an inorganic insulating material such as silicon oxide, silicon nitride oxide, silicon nitride, hafnium oxide, aluminum oxide, or tantalum oxide. Note that the insulating layer 138 functions as a base of the transistor 162. The insulating layer 138 is not necessarily provided.

Figure 5A:
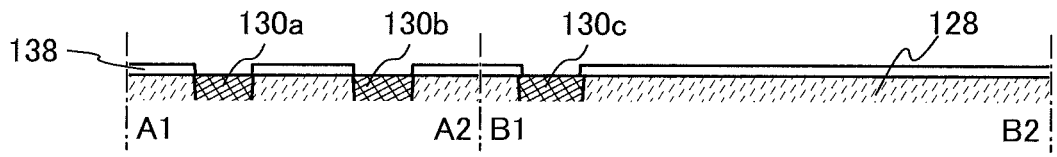
FIGS. 5A to 5E are cross-sectional views relating to manufacturing steps of a semiconductor device.

Next, openings that reach the source or drain electrode 130a, the source or drain electrode 130b, and the electrode 130c are formed in the insulating layer 138 (see FIG. 5A). The openings can be formed by a method such as etching with the use of a mask. The mask can be formed by exposure with use of a photomask or the like. Either wet etching or dry etching may be used as the etching; dry etching is preferably used in terms of microfabrication. Note that in the case where the insulating layer 138 is not provided, this step can be omitted.

Figure 5B:
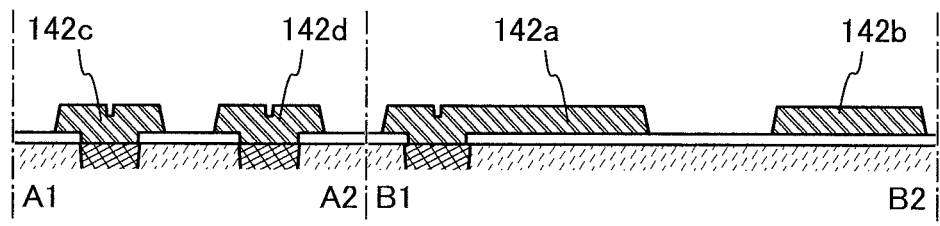

Next, the source or drain electrode 142a, the source or drain electrode 142b, the electrode 142c, and the electrode 142d are formed (see FIG. 5B). The source or drain electrode 142a, the source or drain electrode 142b, the electrode 142c, and the electrode 142d can be formed in such a manner that a conductive layer is formed so as to cover the insulating layer 138 and then is selectively etched.

The conductive layer can be formed by a PVD method typified by a sputtering method or a CVD method such as a plasma CVD method. As a material for the conductive layer, an element selected from aluminum, chromium, copper, tantalum, titanium, molybdenum, or tungsten; an alloy containing any of these elements as a component; or the like can be used. Alternatively, one or more materials selected from manganese, magnesium, zirconium, beryllium, and thorium may be used. Aluminum combined with one or more of elements selected from titanium, tantalum, tungsten, molybdenum, chromium, neodymium, or scandium may be used. The conductive layer can have a single-layer structure or a stacked-layer structure including two or more layers. For example, the conductive layer can have a single-layer structure of an aluminum film containing silicon, a two-layer structure in which a titanium film is stacked over an aluminum film, or a three-layer structure in which a titanium film, an aluminum film, and a titanium film are stacked in this order.

The conductive layer may also be formed using a conductive metal oxide. As the conductive metal oxide, indium oxide ($In_2O_3$), tin oxide ($SnO_2$), zinc oxide (ZnO), an indium oxide-tin oxide alloy ($In_2O_3$—$SnO_2$, which is abbreviated to ITO in some cases), an indium oxide-zinc oxide alloy ($In_2O_3$—ZnO), or any of these metal oxide materials in which silicon or silicon oxide is included can be used.

The channel length (L) of the transistor is determined by a distance between a lower edge portion of the source or drain electrode 142a and a lower edge portion of the source or drain electrode 142b. In the case where the channel length (L) is less than 25 nm, a mask for the etching is preferably formed with the use of extreme ultraviolet having a wavelength of several nanometers to several tens of nanometers. Light exposure with extreme ultraviolet leads to a high resolution and a large depth of focus. Accordingly, a pattern in which the channel length (L) is less than 25 nm can be formed, and also, the channel length (L) can be greater than or equal to 10 nm and less than or equal to 1000 nm. In this manner, the transistor with a small channel length is preferable because the transistor with a small channel length leads to high operation speed of a circuit and low power consumption.

In addition, end portions of the source or drain electrode 142a and the source or drain electrode 142b are preferably formed to have tapered shapes. This is because when the end portions of the source or drain electrode 142a and the source or drain electrode 142b have tapered shapes, coverage with an oxide semiconductor layer to be formed later can be increased and disconnection can be prevented. Here, a taper angle is, for example, preferably greater than or equal to 30° and less than or equal to 60°. Note that the taper angle refers to an inclination angle formed with a side surface and a bottom surface of a layer having a tapered shape (for example, the source or drain electrode 142a) when seen from a direction perpendicular to a cross section (a plane perpendicular to a surface of a substrate) of the layer.

Figure 5C:
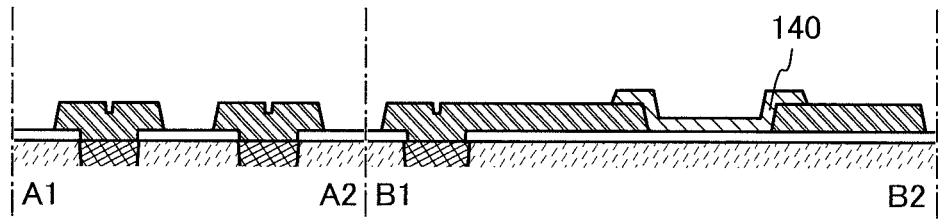
Figure 5D:
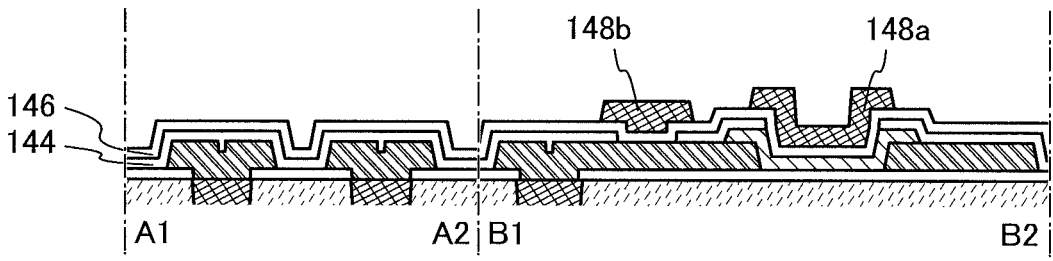

Next, an oxide semiconductor layer is formed to cover the source or drain electrode 142a, the source or drain electrode 142b, and the like, and then processed by a method such as etching with the use of a mask, so that the island-shaped oxide semiconductor layer 140 is formed (see FIG. 5C).

The oxide semiconductor layer is preferably formed using a sputtering method. As the oxide semiconductor layer, a four-component metal oxide such as an In—Sn—Ga—Zn—O-based film; a three-component metal oxide such as an In—Ga—Zn—O-based film, an In—Sn—Zn—O-based film, an In—Al—Zn—O-based film, a Sn—Ga—Zn—O-based film, an Al—Ga—Zn—O-based film, and a Sn—Al—Zn—O-based film; a two-component metal oxide such as an In—Zn—O-based film, a Sn—Zn—O-based film, an Al—Zn—O-based film, a Zn—Mg—O-based film, a Sn—Mg—O-based film, an In—Mg—O-based film; or an In—O-based film, a Sn—O-based film, or a Zn—O-based film can be used. Note that silicon may be added into the metal oxide. For example, the oxide semiconductor layer may be formed with the use of a target containing $SiO_2$ at 2 wt % to 10 wt % inclusive.

In particular, when an In—Ga—Zn—O-based metal oxide is used, a semiconductor device which has sufficiently high resistance (sufficiently low off current) when there is no electric field and has high field-effect mobility can be formed. In view of this point, the In—Ga—Zn—O-based metal oxide is suitable for a semiconductor material used for the semiconductor device.

As a typical example of the In—Ga—Zn—O-based metal oxide, one represented by $InGaO_3 (ZnO)_m$ (m>0) is given. In addition, one represented by $InMO_3(ZnO)_m$ (m>0) is given using M instead of Ga. Here, M denotes one or more of metal elements selected from gallium (Ga), aluminum (Al), iron (Fe), nickel (Ni), manganese (Mn), and cobalt (Co) and the like. For example, M can be Ga, Ga and Al, Ga and Fe, Ga and Ni, Ga and Mn, Ga and Co, or the like. Note that above composition is obtained by a crystal structure and only one example.

In this embodiment, the oxide semiconductor layer is formed by a sputtering method with use of an In—Ga—Zn—O-based metal oxide target.

In forming the oxide semiconductor layer, the substrate is held in a treatment chamber that is maintained at reduced pressure and the substrate temperature is preferably set to a temperature higher than or equal to 100° C. and lower than or equal to 600° C., and more preferably a temperature higher than or equal to 200° C. and lower than or equal to 400° C. Here, the oxide semiconductor layer is formed while the substrate heated, so that concentration of impurities in the oxide semiconductor layer can be reduced, and damage to the oxide semiconductor layer due to sputtering can be reduced.

A preferable atmosphere for formation of the oxide semiconductor layer is a rare gas (typically argon) atmosphere, an oxygen atmosphere, or a mixed atmosphere of a rare gas (typically argon) and oxygen in which impurities such as hydrogen, water, a hydroxyl group, and a hydride are reduced sufficiently. Specifically, it is preferable to use a high-purity gas atmosphere, for example, from which an impurity such as hydrogen, water, a hydroxyl group, or hydride is removed so that the concentration is decreased to 1 ppm or lower (preferably 10 ppb or lower).

Here, in order to remove residual moisture from the chamber, an adsorption-type vacuum pump is preferably used. For example, a cryopump, an ion pump, or a titanium sublimation pump can be used. As an exhaustion unit, a turbo molecular pump to which a cold trap is added may be used. In the deposition chamber that is evacuated with the cryopump, a hydrogen atom and a compound containing a hydrogen atom such as water ($H_2O$) (and preferably also a compound containing a carbon atom), for example, are removed, whereby the impurity concentration of the oxide semiconductor layer formed in the deposition chamber can be reduced.

The oxide semiconductor layer is formed to have a thickness greater than or equal to 2 nm and less than or equal to 200 nm, preferably greater than or equal to 5 nm and less than or equal to 30 nm. Note that an appropriate thickness differs depending on an oxide semiconductor material, and the thickness is set as appropriate depending on the material to be used.

In addition, when a pulsed direct-current (DC) power source is used in formation of the oxide semiconductor layer, dust (powder or flake-like substances formed at the time of deposition) can be reduced and the thickness can be uniform.

Note that the sputtering conditions for depositing the oxide semiconductor layer can be as follows: the distance between the substrate and the target is 170 mm, the pressure is 0.4 Pa, the direct current (DC) power is 0.5 kW, and the atmosphere is an oxygen atmosphere (the proportion of the oxygen flow is 100%).

Note that before the oxide semiconductor layer is formed by sputtering, dust attached to a surface of the insulating layer 138 is preferably removed by reverse sputtering where plasma is generated by the introduction of an argon gas. Here, the reverse sputtering is a method by which ions collide with a surface to be processed so that the surface is modified, in contrast to normal sputtering by which ions collide with a sputtering target. An example of a method for making ions collide with a surface to be processed is a method in which high-frequency voltage is applied to the surface in an argon atmosphere so that plasma is generated near a substrate. Note that a nitrogen atmosphere, a helium atmosphere, an oxygen atmosphere, or the like may be used instead of an argon atmosphere.

As an etching method for the oxide semiconductor layer, either dry etching or wet etching may be employed. It is needless to say that dry etching and wet etching can be used in combination. The etching conditions (e.g., an etching gas or an etching solution, etching time, and temperature) may be set as appropriate depending on the material so that the oxide semiconductor layer can be etched into a desired shape.

An example of an etching gas used for dry etching is a gas containing chlorine (a chlorine-based gas such as chlorine ($Cl_2$), boron trichloride ($BCl_3$), silicon tetrachloride ($SiCl_4$), or carbon tetrachloride ($CCl_4$)). Moreover, a gas containing fluorine (a fluorine-based gas such as carbon tetrafluoride ($CF_4$), sulfur hexafluoride ($SF_6$), nitrogen trifluoride ($NF_3$), or trifluoromethane ($CHF_3$)), hydrogen bromide (HBr), oxygen ($O_2$), any of these gases to which a rare gas such as helium (He) or argon (Ar) is added, or the like may be used.

As the dry etching method, a parallel plate RIE (reactive ion etching) method or an ICP (inductively coupled plasma) etching method can be used. In order to etch the oxide semiconductor layer into a desired shape, etching conditions (e.g., the amount of electric power applied to a coiled electrode, the amount of electric power applied to an electrode on the substrate side, and the electrode temperature on the substrate side) are set as appropriate.

As an etchant used for wet etching, a solution obtained by mixing phosphoric acid, acetic acid, and nitric acid, an ammonia peroxide mixture (hydrogen peroxide water at 31 wt %:ammonia water at 28 wt %:water=5:2:2), or the like can be used. An etchant such as ITO07N (produced by KANTO CHEMICAL CO., INC.) may also be used.

Then, first heat treatment is preferably performed on the oxide semiconductor layer. By this first heat treatment, impurities such as hydrogen in the oxide semiconductor layer can be removed. Note that in the case where the first heat treatment is performed after etching, there is an advantage that time for etching can be shortened even when wet etching is used. The temperature of the first heat treatment is set to a temperature higher than or equal to 300° C. and lower than or equal to 750° C., preferably higher than or equal to 400° C. and lower than or equal to 700° C. For example, the substrate is introduced into an electric furnace in which a resistance heating element or the like is used and the oxide semiconductor layer 140 is subjected to heat treatment at 450° C. for one hour in a nitrogen atmosphere. The oxide semiconductor layer 140 is not exposed to the air during the heat treatment so that entry of water and hydrogen (including moisture or the like) can be prevented. In addition, the temperature of the first heat treatment is preferably determined in consideration of heat resistance of electrodes, wirings, or the like of the transistor 160 positioned in the lower layer.

The heat treatment apparatus is not limited to the electric furnace and can be an apparatus for heating an object by thermal radiation or thermal conduction from a medium such as a heated gas. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for performing heat treatment using a high-temperature gas. As the gas, an inert gas that does not react with an object by heat treatment, for example, nitrogen or a rare gas such as argon is used.

For example, as the first heat treatment, a GRTA process may be performed as follows. The substrate is put in an inert gas that has been heated to a high temperature of 650° C. to 700° C., heated for several minutes, and taken out of the inert gas. The GRTA process enables high-temperature heat treatment for a short time. In addition, since the first heat treatment is performed for a short time, a substrate with low heat resistance, such as a glass substrate, can be used even under a temperature condition which exceeds the strain point of the substrate.

Note that the first heat treatment is preferably performed in an atmosphere which contains nitrogen or a rare gas (e.g., helium, neon, or argon) as its main component and does not contain hydrogen, water, or the like. For example, the purity of nitrogen or a rare gas such as helium, neon, or argon introduced into a heat treatment apparatus is greater than or equal to 6 N (99.9999%), preferably greater than or equal to 7 N (99.99999%) (i.e., the impurity concentration is less than or equal to 1 ppm, preferably less than or equal to 0.1 ppm).

In some cases, the oxide semiconductor layer might be crystallized to be a semiconductor layer containing a crystal component depending on the conditions of the first heat treatment or the material of the oxide semiconductor layer. Further, depending on the conditions of the first heat treatment or the material of the oxide semiconductor layer, the oxide semiconductor layer may be an amorphous oxide semiconductor layer containing no crystalline component.

In addition, electric characteristics of the oxide semiconductor layer can be changed by providing a crystal layer over the amorphous surface of the oxide semiconductor layer. For example, by providing a crystal layer having electrical anisotropy in which crystal grains are aligned, the electric characteristics of the oxide semiconductor layer can be changed.

The first heat treatment for the oxide semiconductor layer 140 can be performed on the oxide semiconductor layer that has not yet been processed into the island-shaped oxide semiconductor layer 140. In that case, after the first heat treatment, the substrate is taken out of the heating apparatus and a photolithography step is performed.

Note that the above-described heat treatment can be referred to as dehydrogenation treatment (dehydration treatment), or the like because of its effect of dehydrogenation (dehydration) on the oxide semiconductor layer 140. Such treatment can be performed in any of timings such as after the oxide semiconductor layer is formed, after an insulating layer (the gate insulating layer or the like) is formed over the oxide semiconductor layer 140, or after the gate electrode is formed. Such treatment may be conducted once or plural times.

In addition, in the case where the oxide semiconductor layer whose hydrogen is sufficiently reduced can be obtained by a method in which an atmosphere relating to formation of the oxide semiconductor layer is controlled or the like, the first heat treatment can be omitted.

Note that plasma treatment may be performed with the use of a gas such as $N_2O$, $N_2$, or Ar after the above step. The plasma treatment can remove water or the like that adheres to an exposed surface of the oxide semiconductor layer. In addition, plasma treatment may be performed using a gas containing oxygen, such as a mixed gas of oxygen and argon, or the like. In this manner, the oxide semiconductor layer is supplied with oxygen and defect levels in the energy gap resulted from oxygen deficiency can be reduced.

Next, the insulating layer 144 is formed above the source or drain electrode 142a, the source or drain electrode 142b, the oxide semiconductor layer 140, and the like, and openings are formed in part of a region where the gate electrode is formed and part of a region where the electrode of the capacitor is formed. Then, the gate insulating layer 146 is formed to cover a region including the openings. After that, the gate electrode 148a and the electrode 148b are formed (see FIG. 5D). The openings in the insulating layer 144 can be formed by a method such as etching using a mask. The gate electrode 148a and the electrode 148b can be formed in such a manner that a conductive layer is formed to cover the gate insulating layer 146 and then etched selectively.

The insulating layer 144 and the gate insulating layer 146 can be formed by a CVD method, a sputtering method, or the like. In addition, the insulating layer 144 and the gate insulating layer 146 are preferably formed to containing silicon oxide, silicon nitride, silicon oxynitride, aluminum oxide, hafnium oxide, tantalum oxide, or the like. The insulating layer 144 and the gate insulating layer 146 may have a single-layer structure or a stacked-layer structure. There is no particular limitation on the thicknesses of the insulating layer 144 and the gate insulating layer 146, but each of them can be formed to a thickness greater than or equal to 10 nm and less than or equal to 500 nm, for example. Note that the insulating layer 144 is provided to reduce capacitance which is generated when electrodes overlap with each other or the like. For example, when the insulating layer 144 is formed, capacitance generated by the source or drain electrode 142a or the like with the gate electrode 148a can be reduced.

The insulating layer 144 and the gate insulating layer 146 are preferably formed by a method in which an impurity such as hydrogen or water does not easily enter the insulating layer 144 and the gate insulating layer 146. This is because when the insulating layer 144 and the gate insulating layer 146 contain hydrogen, intrusion of hydrogen to the oxide semiconductor layer, extraction of oxygen from the oxide semiconductor layer, or the like may occur.

For example, in the case where the insulating layer 144 and the gate insulating layer 146 are formed by a sputtering method, a high-purity gas in which the concentration of an impurity such as hydrogen, water, a hydroxyl group, or hydride is reduced to approximately 1 ppm (preferably approximately 10 ppb) is used as a sputtering gas. In addition, residual moisture in the treatment chamber is preferably removed.

Note that an oxide semiconductor that becomes intrinsic by removal of impurities (a highly purified oxide semiconductor) as described in this embodiment is quite susceptible to the interface level and the interface charge; therefore, when such an oxide semiconductor is used for the oxide semiconductor layer, the interface with the gate insulating layer is important. Therefore, the gate insulating layer 146 which is in contact with the highly-purified oxide semiconductor needs high quality.

For example, the gate insulating layer 146 is preferably formed by a high-density plasma CVD method using a microwave (the frequency is 2.45 GHz) because the gate insulating layer 146 can be dense and have high withstand voltage and high quality. This is because when the highly-purified oxide semiconductor is closely in contact with the high-quality gate insulating film, the interface state can be reduced and interface properties can be favorable.

It is needless to say that, even when a highly-purified oxide semiconductor layer is used, another method such as a sputtering method or a plasma CVD method can be employed as long as a good-quality insulating layer can be formed as the gate insulating layer. Moreover, it is possible to use an insulating layer whose quality and interface characteristics are improved with heat treatment performed after the formation of the insulating layer. In any case, the gate insulating layer 146 with good film-quality in which interface state density of the gate insulating layer 146 with the oxide semiconductor layer can be reduced may be formed.

In this embodiment, insulating layers containing silicon oxide which serve as the insulating layer 144 and the gate insulating layer 146 are formed by a sputtering method.

After the insulating layer 144 or the gate insulating layer 146 is formed, second heat treatment (preferably at a temperature higher than or equal to 200° C. and lower than or equal to 400° C., for example, higher than or equal to 250° C. and lower than or equal to 350° C.) in an inert gas atmosphere or an oxygen atmosphere is preferably performed. For example, the second heat treatment is performed at 250° C. for one hour in a nitrogen atmosphere. The second heat treatment can reduce variation in electric characteristics of the transistor. Further, by the second heat treatment, oxygen can be supplied to the oxide semiconductor from the insulating layer containing oxygen and defects levels in the energy gap caused by oxygen deficiency can be reduced. Without limitation to the above atmosphere, the atmosphere of the heat treatment may be an air atmosphere, or the like. However, in this case, an atmosphere in which hydrogen, water, and the like are removed is preferably employed in order that hydrogen is not mixed to the oxide semiconductor layer. In addition, the second heat treatment is not a required step and therefore may be omitted.

The conductive layer to be the gate electrode 148a and the electrode 148b can be formed by a PVD method typified by a sputtering method or a CVD method such as a plasma CVD method. The details are similar to those of the source or drain electrode 142a or the like; thus, the description thereof can be referred to.

Either dry etching or wet etching may be used as the etching for forming the openings in the insulating layer 144 or the etching for forming the gate electrode 148a or the like. It is needless to say that dry etching and wet etching can be used in combination. The etching conditions (e.g., an etching gas or an etching solution, etching time, and temperature) may be set as appropriate depending on the material so that a desired shape can be obtained.

Figure 5E:
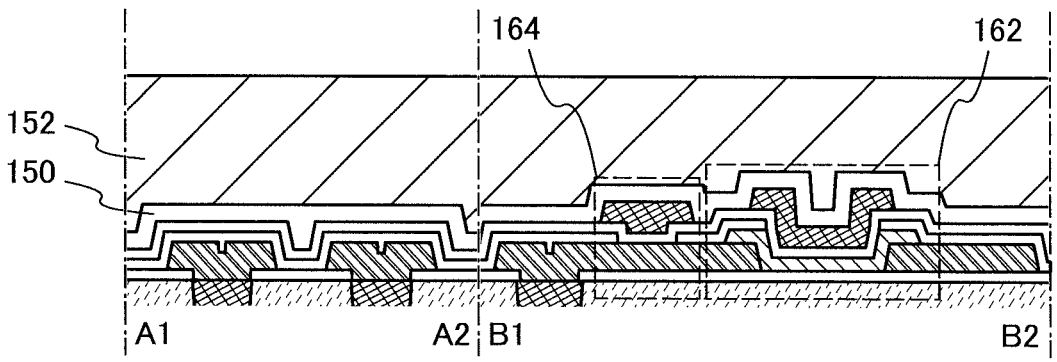

Next, the protective insulating layer 150 and the interlayer insulating layer 152 are formed (see FIG. 5E).

The protective insulating layer 150 and the interlayer insulating layer 152 can be formed by a PVD method, a CVD method, or the like. The protective insulating layer 150 and the interlayer insulating layer 152 can be formed using an inorganic insulating material such as silicon oxide, silicon nitride oxide, silicon nitride, hafnium oxide, aluminum oxide, or tantalum oxide.

Note that since the protective insulating layer 150 is positioned relatively near the oxide semiconductor layer 140, the protective insulating layer 150 is preferably formed by a method by which impurities such as hydrogen and water are not easily mixed, such as a sputtering method.

Further, the interlayer insulating layer 152 is preferably formed so as to have a planarized surface. This is because an electrode, a wiring, or the like can be favorably formed over the interlayer insulating layer 152 when the interlayer insulating layer 152 is formed so as to have a flat surface.

Note that the protective insulating layer 150 or the interlayer insulating layer 152 is not a required component and may be omitted as appropriate.

As described above, the transistor 162 including an oxide semiconductor and the capacitor 164 are completed (see FIG. 5E).

Off current is extremely small in the transistor 162 including an oxide semiconductor which is manufactured by the above method. For example, the carrier density of the oxide semiconductor which is intrinsic (i-type) enough is, for example, less than $1 \times 10^{12}/cm^3$, or preferably less than $1.45 \times 10^{10}/cm^3$, and the off current of the transistor is, for example, less than or equal to $1 \times 10^{-13}$ A in the case where a drain voltage $V_d$ is +1 V or +10 V and a gate voltage $V_g$ ranges from −5 V to −20 V. Therefore, the data retention period of the semiconductor device can be sufficiently ensured. In addition, in the case where an oxide semiconductor which is sufficiently intrinsic is used, leakage current at room temperature can be reduced to approximately $1 \times 10^{-20}$ A (10 zA (zeptoampere) to $1 \times 10^{-19}$ A (100 zA). In other words, leakage current can be substantially 0. With the use of such an oxide semiconductor, the semiconductor device in which the data retention period is sufficiently ensured can be provided.

The capacitor 164 is also provided, which facilitates retention of charge given to the gate electrode of the transistor 160 and reading of stored contents. In particular, the capacitor 164 can be formed without increase of steps by the method described in this embodiment, which is advantageous in view of cost cut.

Note that the semiconductor device having a stacked-layer (two-layer) structure of the transistor including a material other than an oxide semiconductor and the transistor including an oxide semiconductor is described in this embodiment. However, a structure used for the disclosed invention is not limited to the stacked-layer structure. A single-layer structure or a stacked-layer structure of three layers or more may be employed.

In addition, positions or connection relations of electrodes (wirings), insulating layers, semiconductor layers, and the like; parameters such as a width of a wiring, a channel width, a channel length; or other conditions can be changed as appropriate depending on functions needed for a semiconductor integrated circuit. For example, structures of electrodes, wirings, or the like in the case of a semiconductor device with a single-layer structure are largely different from those in the case of a semiconductor device with a stacked-layer structure.

The structures, methods, and the like described in this embodiment can be combined as appropriate with any of the structures, methods, and the like described in the other embodiments.

Embodiment 2

In this embodiment, a semiconductor device which is different from that described in the above embodiment and a method for manufacturing a semiconductor device are described with reference to FIGS. 6A and 6B and FIGS. 7A to 7E. Note that the structure and the manufacturing process of the semiconductor device in this embodiment have a lot in common with those in Embodiment 1. Therefore, in the following description, repeated description of the same portions is omitted, and different points are described in detail.

<Planar Structure and Cross-Sectional Structure of Semiconductor Device>

Figure 6A:
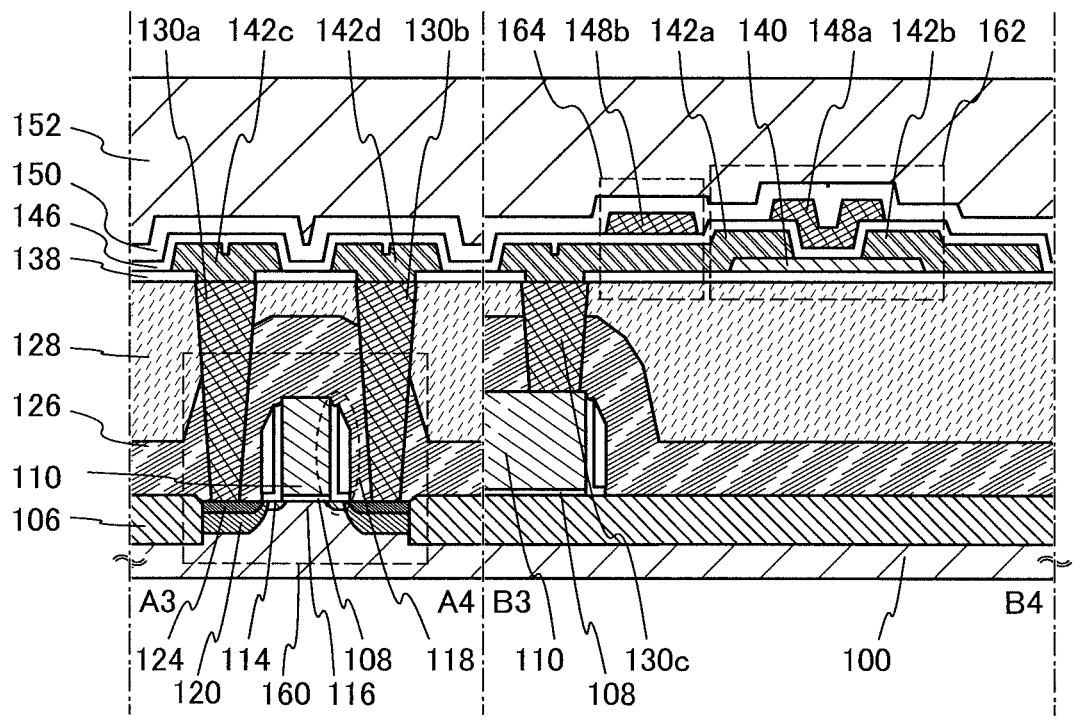
FIGS. 6A and 6B are a cross-sectional view and a plan view of a semiconductor device.
Figure 6B:
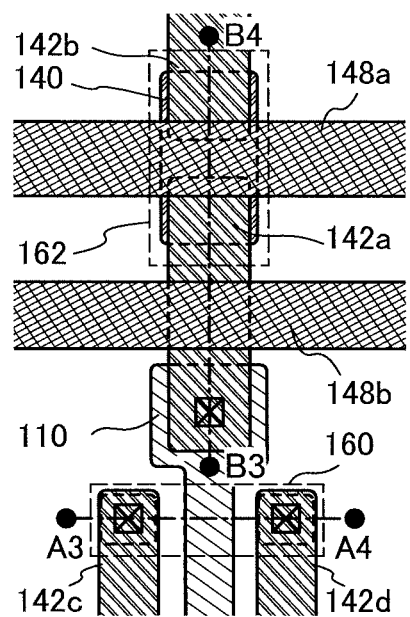

FIGS. 6A and 6B illustrate an example of a structure of the semiconductor device. FIGS. 6A and 6B illustrate a cross section of the semiconductor device and a plan view thereof, respectively. Here, FIG. 6A corresponds to a cross section taken along line A3-A4 and line B3-B4 of FIG. 6B. In the semiconductor device illustrated in FIGS. 6A and 6B, in a similar manner to FIGS. 1A and 1B, a transistor 160 including a material other than an oxide semiconductor is included in a lower portion, and a transistor 162 including an oxide semiconductor and a capacitor 164 are included in an upper portion. Since the semiconductor device described in this embodiment is not provided with an insulating layer 144, the manufacturing process is simplified and manufacturing cost is lowered as compared to the semiconductor device illustrated in FIG. 1A. Note that the insulating layer 144 may be provided in order to reduce capacitance due to a gate electrode 148a or the like.

The transistor 162 illustrated in FIG. 6A includes an oxide semiconductor layer 140 provided over an insulating layer 138; a source or drain electrode 142a and a source or drain electrode 142b which are electrically connected to the oxide semiconductor layer 140; a gate insulating layer 146 covering the source or drain electrode 142a, the source or drain electrode 142b, and the oxide semiconductor layer 140; and the gate electrode 148a overlapping with the oxide semiconductor layer 140 over the gate insulating layer 146. Note that the transistor 162 illustrated in FIG. 6A is a top-gate transistor and can be referred to a top-gate top-contact transistor because the oxide semiconductor layer 140 and the source or drain electrode 142a or the like are connected to each other in a region including a top surface of the oxide semiconductor layer 140.

<Method for Manufacturing Semiconductor Device>

Next, an example of a method for manufacturing the semiconductor device is described. In the following description, a method for manufacturing the transistor 162 in the upper portion is described with reference to FIGS. 7A to 7E. Note that since a manufacturing method of the transistor 160 in the lower portion is the same as the manufacturing method illustrated in FIG. 4, description thereof is omitted.

First, the insulating layer 138 is formed over an interlayer insulating layer 128, a source or drain electrode 130a, a source or drain electrode 130b, and an electrode 130c. Then, openings reaching the source or drain electrode 130a, the source or drain electrode 130b, and the electrode 130c are formed in the insulating layer 138 (see FIG. 7A). Description of a material and a formation method of the insulating layer 138 is omitted because FIG. 5A can be referred to. In addition, the openings can be formed by a method such as etching with the use of a mask.

Figure 7A:
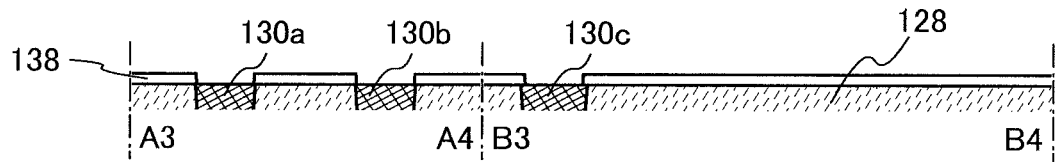
FIGS. 7A to 7E are cross-sectional views relating to manufacturing steps of a semiconductor device.
Figure 7B:
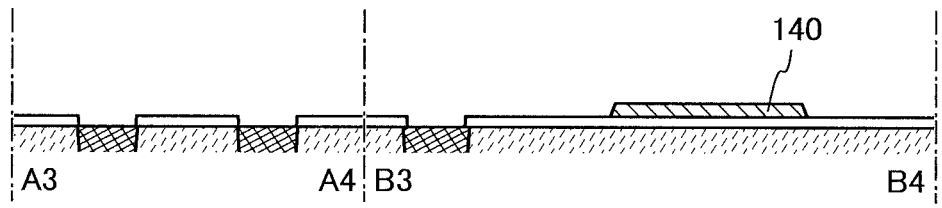
Figure 7C:
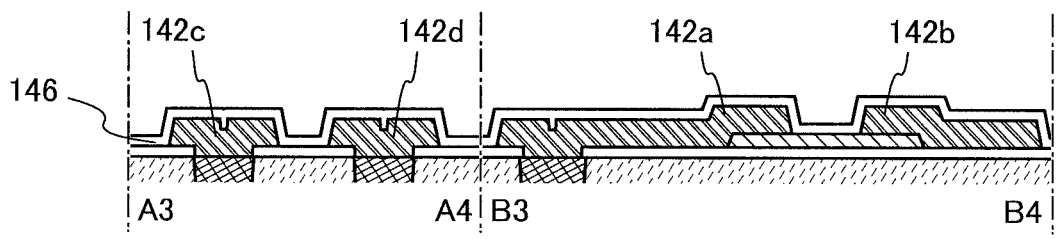

Next, an oxide semiconductor layer is formed over the insulating layer 138 and processed by a method such as etching with the use of a mask, so that the island-shaped oxide semiconductor layer 140 is formed (see FIG. 7B). Description of a material and a formation method of the island-shaped oxide semiconductor layer 140 is omitted because FIG. 5C can be referred to.

Next, a conductive layer is formed to cover the insulating layer 138, the openings provided in the insulating layer 138, and the island-shaped oxide semiconductor layer 140, and then processed by a method such as etching with the use of a mask, so that the source or drain electrode 142a and the source or drain electrode 142b which are in contact with the oxide semiconductor layer 140, an electrode 142c, and an electrode 142d are formed. Then, the gate insulating layer 146 is formed to cover the source or drain electrode 142a, the source or drain electrode 142b, the electrode 142c, and the electrode 142d (see FIG. 7C). Description of a material and a formation method of the source or drain electrode 142a, the source or drain electrode 142b, the electrode 142c, and the electrode 142d is omitted because FIG. 5B can be referred to. In addition, description of a material and a formation method of the gate insulating layer 146 is omitted because FIG. 5D can be referred to.

Figure 7D:
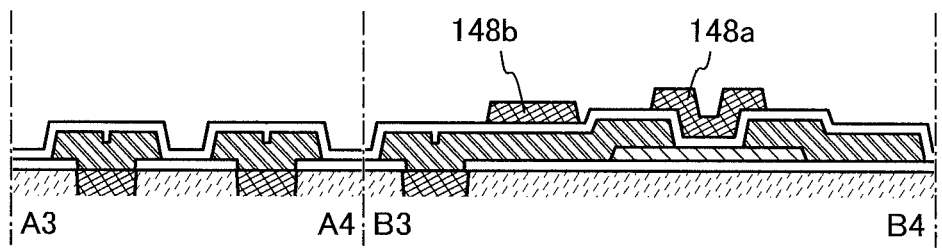

Then, a conductive layer is formed over the gate insulating layer 146 and processed by a method such as etching with the use of a mask, so that the gate electrode 148a and an electrode 148b are formed (see FIG. 7D). Description of a material and a formation method of the gate electrode 148a and the electrode 148b is omitted because FIG. 5D can be referred to.

Figure 7E:
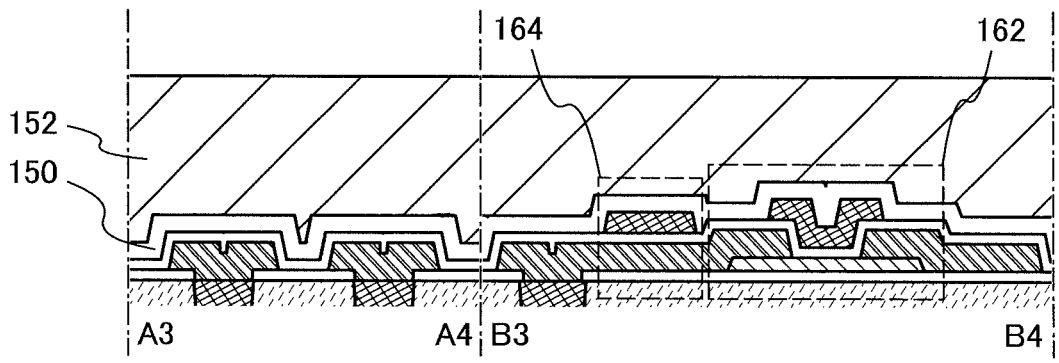

Next, a protective insulating layer 150 and an interlayer insulating layer 152 are formed to cover the gate insulating layer 146, the gate electrode 148a, and the electrode 148b (see FIG. 7E). Description of materials and formation methods of the protective insulating layer 150 and the interlayer insulating layer 152 is omitted because FIG. 5E can be referred to.

Through the above steps, the semiconductor device illustrated in FIGS. 6A and 6B can be manufactured.

Embodiment 3

In this embodiment, examples of a circuit configuration, operation, and the like of a semiconductor device which is formed using a plurality of semiconductor devices illustrated in Embodiment 1 are described with reference to FIGS. 8A and 8B and FIGS. 9A and 9B.

<Circuit Configuration and Operation of Semiconductor Device>

Figure 8A:
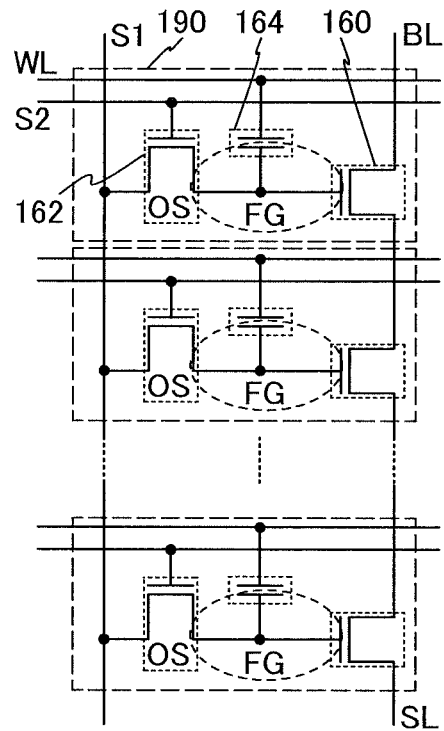
FIGS. 8A and 8B are circuit diagrams of semiconductor devices.
Figure 8B:
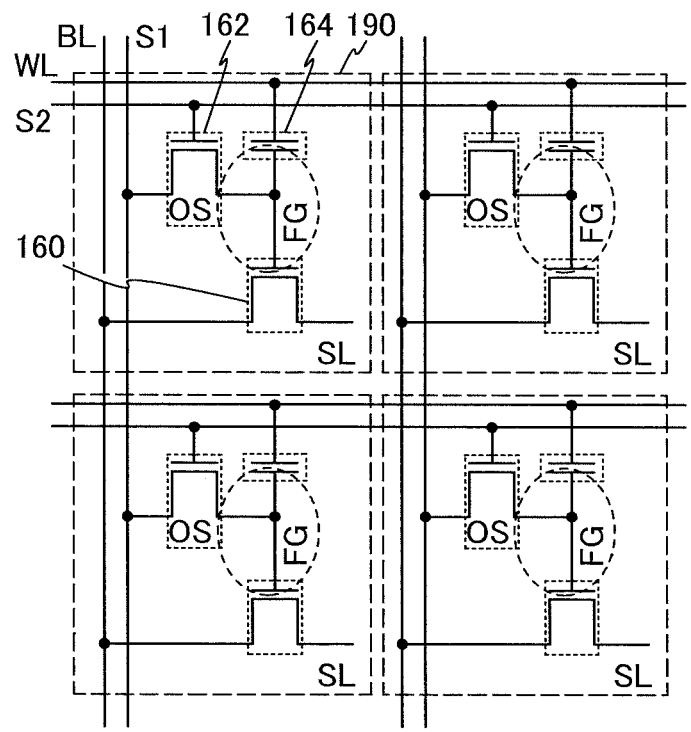

FIGS. 8A and 8B are examples of circuit diagrams of semiconductor devices each including a plurality of semiconductor devices (hereinafter also referred to as memory cells 190) illustrated in FIG. 3A1. FIG. 8A is a circuit diagram of a NAND semiconductor device in which the memory cells 190 are connected in series, and FIG. 8B is a circuit diagram of a NOR semiconductor device in which the memory cells 190 are connected in parallel.

The semiconductor device in FIG. 8A includes a source line SL, a bit line BL, a first signal lines S1, a plurality of second signal lines S2, a plurality of word lines WL, and the plurality of memory cells 190. In each of the memory cells 190, a gate electrode of the transistor 160, one of a source electrode and a drain electrode of the transistor 162, and one of electrodes of the capacitor 164 are electrically connected to one another. The first signal line S1 and the other of the source electrode and the drain electrode of the transistor 162 are electrically connected to each other, and the second signal line S2 and a gate electrode of the transistor 162 are electrically connected to each other. The word line WL and the other of the electrodes of the capacitor 164 are electrically connected to each other.

Further, the source electrode of the transistor 160 included in the memory cell 190 is electrically connected to the drain electrode of the transistor 160 in the adjacent memory cell 190. The drain electrode of the transistor 160 included in the memory cell 190 is electrically connected to the source electrode of the transistor 160 in the adjacent memory cell 190. Note that the drain electrode of the transistor 160 included in the memory cell 190 of the plurality of memory cells connected in series, which is provided at one of ends, is electrically connected to the bit line. The source electrode of the transistor 160 included in the memory cell 190 of the plurality of memory cells connected in series, which is provided at the other end, is electrically connected to the source line SL. Note that in FIG. 8A, one source line SL and one bit line BL are provided in the semiconductor device; however, an embodiment of the present invention is not limited to this. A plurality of source lines SL and a plurality of bit lines BL may be provided.

In the semiconductor device in FIG. 8A, writing operation and reading operation are performed in each row. The writing operation is performed as follows. A potential at which the transistor 162 is turned on is supplied to the second signal line S2 of a row where writing is to be performed, so that the transistor 162 of the row where writing is to be performed is turned on. Accordingly, a potential of the first signal line S1 is supplied to the gate electrode of the transistor 160 of the specified row, so that predetermined charge is given to the gate electrode. Thus, data can be written to the memory cell of the specified row.

Further, the reading operation is performed as follows. First, a potential at which the transistor 160 is turned on regardless of charges of the gate electrode of the transistor 160 is supplied to the word lines WL of rows other than a row where reading is to be performed, so that the transistors 160 of the rows other than the row where reading is to be performed are turned on. Then, a constant potential is supplied the source line SL, and the bit line BL is connected to a reading circuit (not shown). Here, the plurality of transistors 160 between the source line SL and the bit line BL are on except the transistors 160 of the row where reading is to be performed; therefore, conductance between the source line SL and the bit line BL is determined by a state of the transistors 160 of the row where reading is to be performed. That is, a potential of the bit line BL which is read out by the reading circuit depends on charge in the gate electrodes of the transistors 160 of the row where reading is to be performed. In such a manner, the reading circuit can read data from the memory cell in the specified row.

The semiconductor device in FIG. 8B includes a plurality of source lines SL, a plurality of bit lines BL, a plurality of first signal lines S1, a plurality of second signal lines S2, a plurality of word lines WL, and a plurality of the memory cells 190. A gate electrode of the transistor 160, one of a source electrode and a drain electrode of the transistor 162, and one of electrodes of the capacitor 164 are electrically connected to one another. The source line SL and a source electrode of the transistor 160 are electrically connected to each other. The bit line BL and a drain electrode of the transistor 160 are electrically connected to each other. The first signal line S1 and the other of the source electrode and the drain electrode of the transistor 162 are electrically connected to each other, and the second signal line S2 and a gate electrode of the transistor 162 are electrically connected to each other. The word line WL and the other of the electrodes of the capacitor 164 are electrically connected to each other.

In the semiconductor device in FIG. 8B, writing operation and reading operation are performed in each row. The writing operation is performed in a manner similar to that of the semiconductor device in FIG. 8A. The reading operation is performed as follows. First, a potential at which an on state or an off state of the transistor 160 is selected depending on charge stored in the gate electrode of the transistor 160 is supplied to the word line WL in a row where reading is performed. Then, a constant potential is supplied to the source line SL, and the bit line BL is connected to the reading circuit (not shown). The transistors 160 in rows which are not selected are in an off state. Here, conductance between the source line SL and the bit line BL is determined by a state of the transistors 160 of the row where reading is to be performed. That is, a potential of the bit line BL which is read out by the reading circuit depends on charge in the gate electrodes of the transistors 160 of the row where reading is to be performed. In such a manner, the reading circuit can read data from the memory cell in specified row.

In the semiconductor devices illustrated in FIGS. 8A and 8B, the transistor 160 including a material other than an oxide semiconductor can operate at sufficiently high speed, and therefore, reading of stored contents or the like can be performed at high speed. Moreover, the transistor 162 including an oxide semiconductor has extremely low off current. For that reason, a potential of the gate electrode of the transistor 160 can be retained for an extremely long time by turning off the transistor 162. By providing the capacitor 164, retention of charge given to the gate electrode of the transistor 160 and reading of stored contents can be performed easily.

Meanwhile, as for the semiconductor device including the plurality of memory cells described above, reduction of an area occupied by each memory cell becomes an issue in order to suppress cost per storage capacity. In order to solve the issue, for example, in the NAND semiconductor device illustrated in FIG. 8A, each of the transistors 160 connected in series is formed to have such a structure as illustrated in a cross-sectional view of FIG. 9A, whereby an area occupied by each memory cell can be reduced. Note that FIG. 9A corresponds to a cross section taken along lines C1-C2 and D1-D2 in FIG. 9B.

Figure 9A:
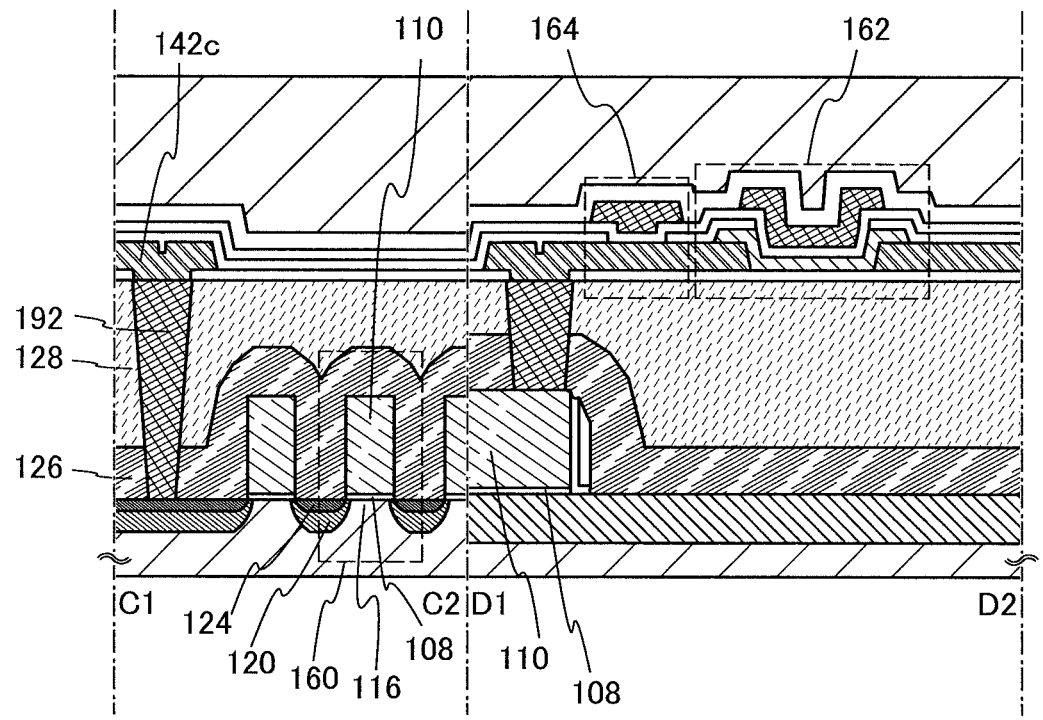
FIGS. 9A and 9B are a cross-sectional view and a plan view of a semiconductor device.

In the semiconductor device illustrated in FIG. 9A, the transistor 160 provided over a substrate 100 is connected to the adjacent transistor 160 via a high-concentration impurity region 120 (also simply referred to as an impurity region) and a metal compound region 124. That is, the high-concentration impurity region 120 and the metal compound region 124 which are provided between the transistors 160 function as a source region of one of the transistors 160 and a drain region of the other of the transistors 160.

In addition, an interlayer insulating layer 126 and an interlayer insulating layer 128 are provided to cover the transistor 160. In addition, at an end of the plurality of transistors 160 connected to each other in series, an electrode 192 which is electrically connected to the metal compound region 124 through an opening formed in the interlayer insulating layer 126 and the interlayer insulating layer 128 is formed.

Figure 9B:
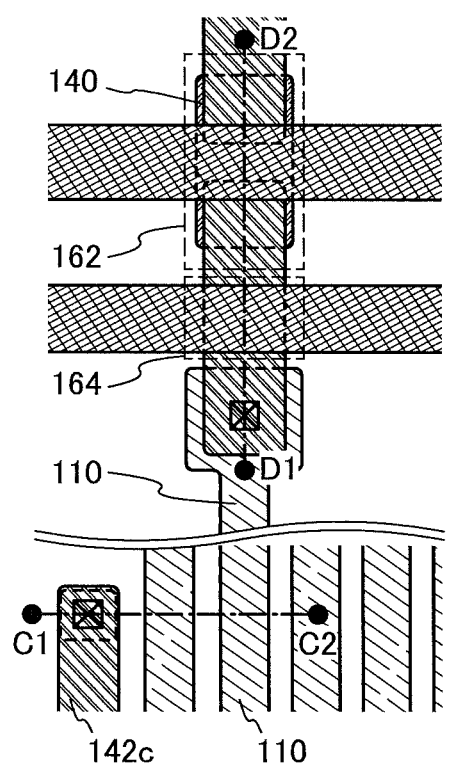

Here, since the transistor 160 has almost the same structure as the transistor 160 illustrated in FIGS. 1A and 1B of Embodiment 1, description of FIGS. 1A and 1B can be referred to for description of the transistor 160 illustrated in FIGS. 9A and 9B. Note that in this embodiment, in order to obtain high integration of the transistor 160, sidewall insulating layers 118 illustrated in FIGS. 1A and 1B are not provided.

In addition, the structure illustrated in FIG. 9A can be employed for not only the NAND semiconductor device illustrated in FIG. 8A but also the NOR semiconductor device illustrated in FIG. 8B. For example, in FIG. 8B, memory cells in adjacent rows may be arranged symmetrically, and the transistors 160 of the memory cells in the adjacent rows may be connected to each other via a high-concentration impurity region 120 and a metal compound region 124. In this case, at least two transistors 160 are connected to each other via the high-concentration impurity region 120 and the metal compound region 124.

When the plurality of transistors 160 are connected to each other in such a manner, high integration of the transistors 160 and the memory cells 190 can be obtained. Accordingly, cost per storage capacity of the semiconductor device can be suppressed.

The structures, methods, and the like described in this embodiment can be combined with any of structures, methods, and the like of the other embodiments as appropriate.

Embodiment 4

Figure 10A:
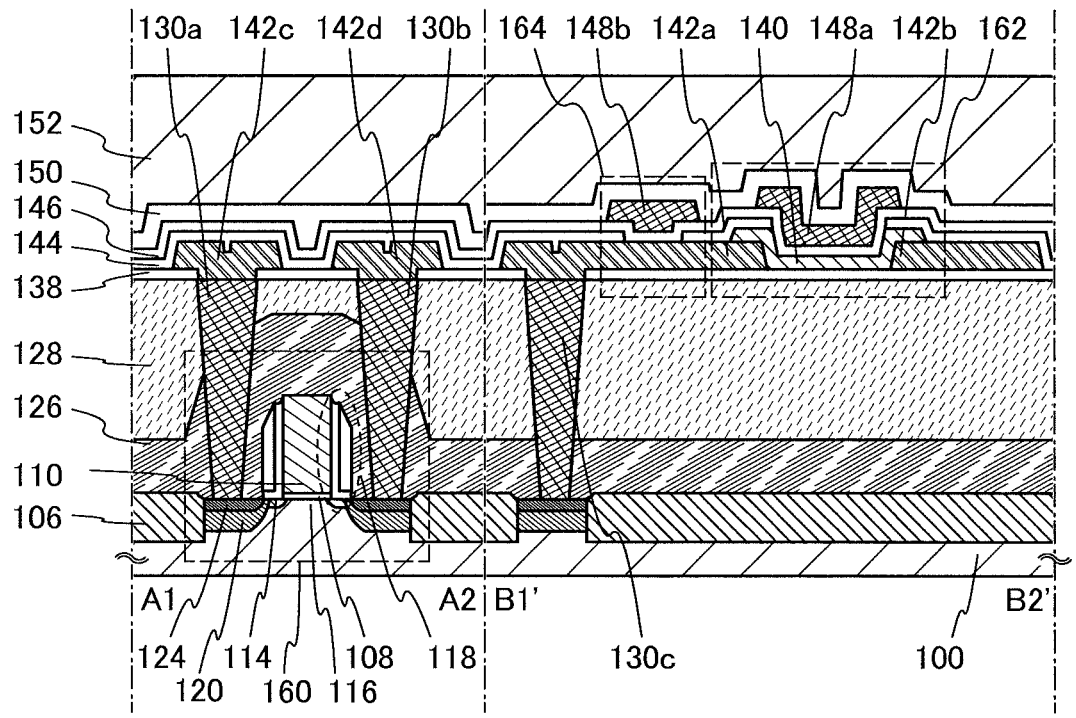
FIGS. 10A and 10B are cross-sectional views of semiconductor devices.
Figure 10B:
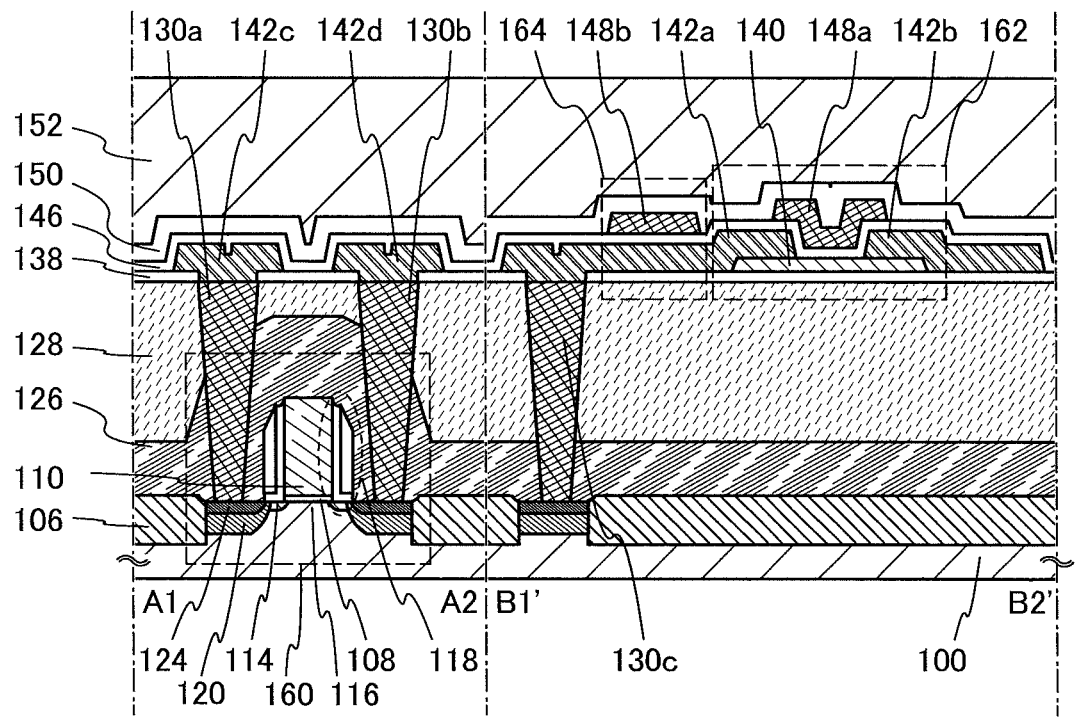

Next, modified examples of a semiconductor device are illustrated in FIGS. 10A and 10B.

A semiconductor device illustrated in FIG. 10A is a modified example of the semiconductor device illustrated in FIG. 1A.

The structure illustrated in FIG. 10A is different from the structure illustrated in FIG. 1A in that an electrode 130c is electrically connected to a metal compound region provided over a substrate 100. In other words, a source or drain electrode 142a and the metal compound region are electrically connected to each other in FIG. 10A, whereas the source or drain electrode 142a and a gate electrode 110 are electrically connected to each other in the structure illustrated in FIG. 1A.

With the structure illustrated in FIG. 10A, a semiconductor device having a circuit configuration which is different from that of the semiconductor device in any of the above embodiments can be obtained.

A semiconductor device illustrated in FIG. 10B is a modified example of the semiconductor device illustrated in FIG. 6A.

The structure illustrated in FIG. 10B is different from the structure illustrated in FIG. 6A in that the electrode 130c and a metal compound region provided over the substrate 100 are electrically connected to each other. In other words, the source or drain electrode 142a and the metal compound region are electrically connected to each other in FIG. 10B, whereas the source or drain electrode 142a and the gate electrode 110 are electrically connected to each other in the structure illustrated in FIG. 6A.

With the structure illustrated in FIG. 10B, a semiconductor device having a circuit configuration which is different from that of the semiconductor device in any of the above embodiments can be obtained.

The structures, methods, and the like described in this embodiment can be combined with any of structures, methods, and the like of the other embodiments as appropriate.

Embodiment 5

Next, another example of the manufacturing method of a transistor including an oxide semiconductor which can be used as the transistor 162 or the like in the above embodiments (such as Embodiment 1) is described with reference to FIGS. 11A to 11E. In this embodiment, description is made in detail on the case where an oxide semiconductor (particularly with an amorphous structure) which is highly purified is used. Although a top-gate transistor is used as an example in the following description, the structure of the transistor is not limited thereto.

First, an insulating layer 202 is formed over a lower layer substrate 200. Then, an oxide semiconductor layer 206 is formed over the insulating layer 202 (see FIG. 11A)

For example, the lower layer substrate 200 can be a structure body below the interlayer insulating layer 128 of the semiconductor device in the above embodiment (FIGS. 1A and 1B, FIGS. 6A and 6B, or the like). For the details thereof, the above embodiment can be referred to. It is preferable that a surface of the lower layer substrate 200 be as flat as possible. For example, difference in height on the surface may be less than or equal to 5 nm, or preferable less than or equal to 1 nm by a chemical mechanical polishing method (a CMP method) or the like. In addition, a root-mean-square (RMS) of a surface roughness may be less than or equal to 2 nm, or preferable less than or equal to 0.4 nm.

The insulating layer 202 serves as a base and can be formed in a manner similar to that of the insulating layer 138, the insulating layer 144, or the like shown in the above embodiments. The above embodiments can be referred to for details of the insulating layer 202. Note that it is preferable to form the insulating layer 202 so as to contain hydrogen or water as little as possible.

As the oxide semiconductor layer 206, any of the following oxide semiconductors can be used: an In—Sn—Ga—Zn—O-based oxide semiconductor which is a four-component metal oxide; an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, or a Sn—Al—Zn—O-based oxide semiconductor which are three-component metal oxides; an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, or an In—Mg—O-based oxide semiconductor which are two-component metal oxides; or an In—O-based oxide semiconductor, a Sn—O-based oxide semiconductor, or a Zn—O-based oxide semiconductor.

In particular, an In—Ga—Zn—O-based oxide semiconductor material has sufficiently high resistance when there is no electric field and thus a sufficiently low off current can be obtained. In addition, having high field-effect mobility, the In—Ga—Zn—O-based oxide semiconductor material is suitable for a semiconductor device.

A typical example of the In—Ga—Zn—O-based oxide semiconductor material is represented by $InGaO_3(ZnO)_m$ (m>0). Another example of the oxide semiconductor material is represented by $InMO_3(ZnO)_m$ (m>0) where M is used instead of Ga. Here, M denotes one or more of metal elements selected from gallium (Ga), aluminum (Al), iron (Fe), nickel (Ni), manganese (Mn), cobalt (Co), and the like. For example, M can be Ga, Ga and Al, Ga and Fe, Ga and Ni, Ga and Mn, Ga and Co, or the like. Note that the aforementioned composition is only an example obtained from a crystalline structure.

As a target for manufacturing the oxide semiconductor layer 206 by a sputtering method, a target represented by a compositional formula of In:Ga:Zn=1:x:y (x is greater than or equal to 0 and y is greater than or equal to 0.5 and less than or equal to 5) may be used. For example, a target having a compositional ratio of In:Ga:Zn=1:1:1 [atomic ratio] (x=1 and y=1) (i.e., $In_2O_3:Ga_2O_3:ZnO=1:1:2$ [molar ratio]) may also be used. In addition, a target having a compositional ratio of In:Ga:Zn=1:1:0.5 [atomic ratio] (x=1 and y=0.5), a target having a compositional ratio of In:Ga:Zn=1:1:2 [atomic ratio] (x=1 and y=2), or a target having a compositional ratio of In:Ga:Zn=1:0:1 [atomic ratio] (x=0 and y=1) may also be used.

The relative density of the metal oxide in the metal oxide target is greater than or equal to 80%, preferably greater than or equal to 95%, and more preferably greater than or equal to 99.9%. The use of the metal oxide target with high relative density makes it possible to form the oxide semiconductor layer 206 having a dense structure.

In this embodiment, the oxide semiconductor layer 206 having an amorphous structure is formed by a sputtering method with the use of an In—Ga—Zn—O-based metal oxide target.

The atmosphere in which the oxide semiconductor layer 206 is formed is preferably a rare gas (typically argon) atmosphere, an oxygen atmosphere, or a mixed atmosphere containing a rare gas (typically argon) and oxygen. Specifically, it is preferable to use, for example, a high-purity gas atmosphere from which an impurity such as hydrogen, water, a hydroxyl group, or hydride is removed to a concentration of 1 ppm or less (preferably, 10 ppb or less).

At the time of forming the oxide semiconductor layer 206, for example, the substrate is held in a treatment chamber kept under reduced pressure and the substrate is heated to a temperature higher than or equal to 100° C. and lower than 550° C., preferably higher than or equal to 200° C. and lower than or equal to 400° C. Then, a sputtering gas from which hydrogen, water, or the like is removed is introduced into the treatment chamber while moisture in the treatment chamber is removed, whereby the oxide semiconductor layer 206 is formed using the aforementioned target. The oxide semiconductor layer 206 is formed while the substrate is heated, so that an impurity contained in the oxide semiconductor layer 206 can be reduced. Moreover, damage due to sputtering can be reduced. An entrapment vacuum pump is preferably used in order to remove moisture remaining in the treatment chamber. For example, a cryopump, an ion pump, or a titanium sublimation pump can be used. Alternatively, a turbo molecular pump provided with a cold trap may also be used. Since hydrogen, water, or the like is removed from the treatment chamber evacuated with a cryopump, the concentration of an impurity in the oxide semiconductor layer 206 can be reduced.

The oxide semiconductor layer 206 can be formed under the following conditions, for example: the distance between the substrate and the target is 170 mm; the pressure is 0.4 Pa; the direct-current (DC) power is 0.5 kW; and the atmosphere is oxygen (the proportion of oxygen is 100%), argon (the proportion of argon is 100%), or a mixed atmosphere containing oxygen and argon. Note that it is preferable to use a pulsed direct-current (DC) power source because dust (such as powder substances formed at the time of deposition) can be reduced and the thickness distribution is uniform. The thickness of the oxide semiconductor layer 206 is 2 nm to 200 nm inclusive, preferably 5 nm to 30 nm inclusive. Note that the appropriate thickness of the oxide semiconductor layer differs depending on the oxide semiconductor material to be used, the intended purpose of a semiconductor device, or the like; therefore, the thickness may be determined in accordance with the material, the intended purpose, or the like.

Note that before the oxide semiconductor layer 206 is formed with a sputtering method, reverse sputtering is preferably performed in which plasma is generated with an argon gas introduced, so that dust on the surface of the insulating layer 202 is removed. Here, the reverse sputtering is a method in which ions collide with a surface to be processed so that the surface is modified, in contrast to normal sputtering in which ions collide with a sputtering target. An example of a method for making ions collide with a surface to be processed is a method in which a high-frequency voltage is applied to the surface to be processed under an argon atmosphere so that plasma is generated near a substrate. Note that an atmosphere of nitrogen, helium, oxygen, or the like may be used instead of an argon atmosphere.

Next, the oxide semiconductor layer 206 is processed with a method such as etching using a mask, whereby an island-shaped oxide semiconductor layer 206a is formed.

As an etching method for the oxide semiconductor layer 206, either dry etching or wet etching may be employed. It is needless to say that dry etching and wet etching can be used in combination. The etching conditions (e.g., an etching gas or an etchant, etching time, and temperature) are set as appropriate depending on the material so that the oxide semiconductor layer can be etched into a desired shape. The oxide semiconductor layer 206 can be etched in a manner similar to that of the oxide semiconductor layer shown in the above embodiments. The above embodiments can be referred to for details of the etching conditions or the like.

After that, heat treatment (first heat treatment) is preferably performed on the oxide semiconductor layer 206a. Through the first heat treatment, excess hydrogen (including water and hydroxyl groups) in the oxide semiconductor layer 206a can be removed, the structure of the oxide semiconductor layer can be aligned, and a defect level of the energy gap in the oxide semiconductor layer 206a can be reduced. The first heat treatment is performed at a temperature higher than or equal to 300° C. and lower than 550° C., or higher than or equal to 400° C. and lower than or equal to 500° C., for example. Note that in the case where the heat treatment is performed after etching, there is an advantage that time for etching can be shortened even when wet etching is used.

The heat treatment can be performed in such a manner that, for example, the lower layer substrate 200 is introduced into an electric furnace using a resistance heating element or the like, and then heated under a nitrogen atmosphere at 450° C. for one hour. The oxide semiconductor layer 206a is not exposed to the air during the heat treatment so that the entry of water or hydrogen can be prevented.

The heat treatment apparatus is not limited to the electric furnace and can be an apparatus for heating an object to be processed by thermal conduction or thermal radiation from a medium such as a heated gas. For example, a rapid thermal annealing (RTA) apparatus such as a gas rapid thermal annealing (GRTA) apparatus or a lamp rapid thermal annealing (LRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high-pressure sodium lamp, or a high-pressure mercury lamp. A GRTA apparatus is an apparatus for performing heat treatment using a high-temperature gas. As the gas, an inert gas which does not react with an object to be processed by heat treatment, for example, nitrogen or a rare gas such as argon is used.

For example, as the first heat treatment, a GRTA process may be performed as follows. The substrate is put in an inert gas atmosphere which is heated, heated for several minutes, and taken out of the inert gas atmosphere. The GRTA process enables high-temperature heat treatment for a short time. Moreover, the GRTA process can be employed even when the temperature exceeds the upper temperature limit of the substrate because it is heat treatment for a short time. Note that the inert gas may be changed during the process to a gas including oxygen. This is because defect levels in the energy gap caused by oxygen deficiency can be reduced by performing the first heat treatment under an atmosphere containing oxygen.

Note that as the inert gas atmosphere, it is preferable to employ an atmosphere that contains nitrogen or a rare gas (e.g., helium, neon, or argon) as its main component and that does not contain water, hydrogen, or the like. For example, the purity of nitrogen or a rare gas such as helium, neon, or argon introduced into the heat treatment apparatus is greater than or equal to 6 N (99.9999%), preferably greater than or equal to 7 N (99.99999%) (i.e., the impurity concentration is less than or equal to 1 ppm, preferably less than or equal to 0.1 ppm).

In any case, when the impurity is reduced through the first heat treatment to form the i-type or substantially i-type oxide semiconductor layer 206a, a transistor with excellent characteristics can be realized.

Note that the first heat treatment can also be performed on the oxide semiconductor layer 206 that has not yet been processed into the island-shaped oxide semiconductor layer 206a. In that case, after the first heat treatment, the bottom substrate 200 is taken out of the heating apparatus and a photolithography step is performed.

The first heat treatment, which has an effect of removing hydrogen or water, can also be referred to as dehydration treatment, dehydrogenation treatment, or the like. The dehydration treatment or dehydrogenation treatment can be performed, for example, after the oxide semiconductor layer is formed, or after a source or drain electrode is stacked over the oxide semiconductor layer 206a. Such dehydration treatment or dehydrogenation treatment may be performed once or plural times.

Next, a conductive layer is formed to be in contact with the oxide semiconductor layer 206a. Then, a source or drain electrode 208a and a source or drain electrode 208b are formed by selectively etching the conductive layer (see FIG. 11B). This step is similar to the step for forming the source or drain electrode 142a and the like described in the above embodiments. The above embodiments can be referred to for details of the step.

Figure 11A:
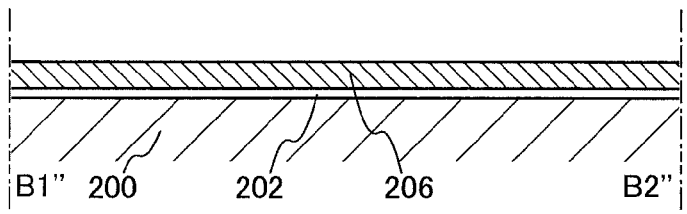
FIGS. 11A to 11E are cross-sectional views relating to manufacturing steps of a semiconductor device.
Figure 11B:
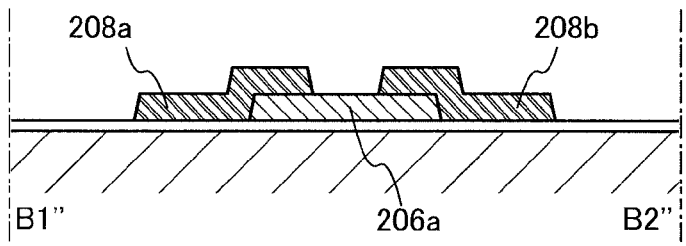
Figure 11C:
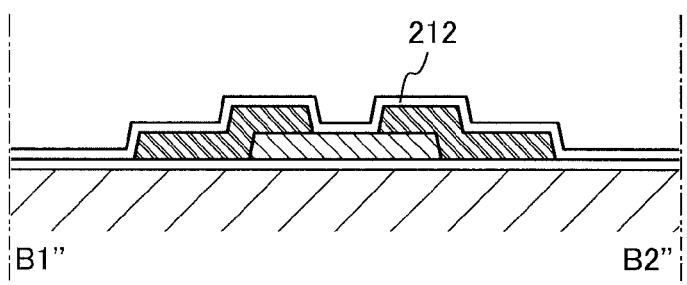

Next, a gate insulating layer 212 in contact with part of the oxide semiconductor layer 206a is formed (see FIG. 11C). The description of the insulating layer 138 in the above embodiments can be referred to for details of the gate insulating layer 212.

After the gate insulating layer 212 is formed, second heat treatment is preferably performed under an inert gas atmosphere or an oxygen atmosphere. The heat treatment is performed at a temperature higher than or equal to 200° C. and lower than or equal to 450° C., preferably higher than or equal to 250° C. and lower than or equal to 350° C. For example, the heat treatment may be performed at 250° C. for one hour under a nitrogen atmosphere. The second heat treatment can reduce variation in electric characteristics of the transistor. In the case where the gate insulating layer 212 contains oxygen, by supplying oxygen to the oxide semiconductor layer 206a to make up oxygen deficiency of the oxide semiconductor layer 206a, an i-type (intrinsic) or substantially i-type oxide semiconductor layer can also be formed.

Note that although the second heat treatment is performed in this embodiment after the gate insulating layer 212 is formed, the timing of the second heat treatment is not limited thereto.

Figure 11D:
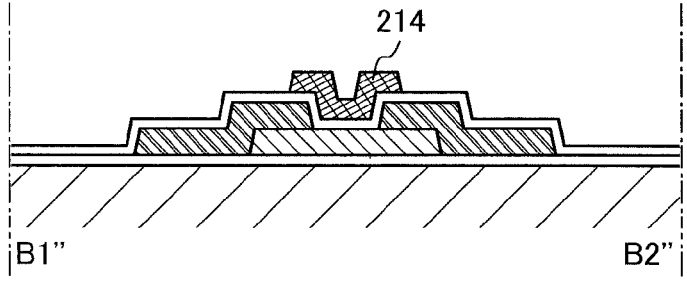

Next, a gate electrode 214 is formed over the gate insulating layer 212 in a region overlapping with the oxide semiconductor layer 206a (see FIG. 11D). The gate electrode 214 can be formed by forming a conductive layer over the gate insulating layer 212 and then selectively patterning the conductive layer. The description of the gate electrode 148a in the above embodiments can be referred to for details of the gate electrode 214.

Figure 11E:
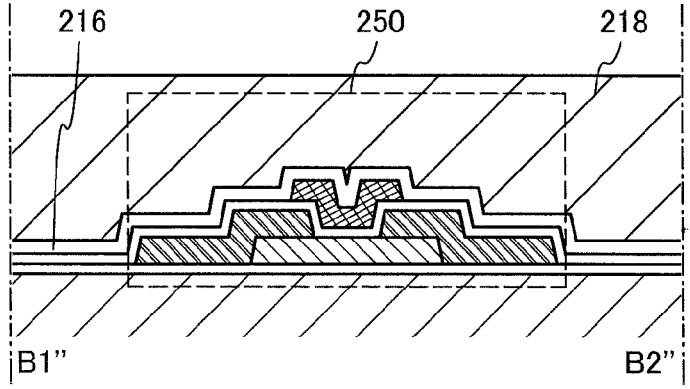

Next, an interlayer insulating layer 216 and an interlayer insulating layer 218 are formed over the gate insulating layer 212 and the gate electrode 214 (see FIG. 11E). The interlayer insulating layer 216 and the interlayer insulating layer 218 can be formed with a PVD method, a CVD method, or the like. The interlayer insulating layer 216 and the interlayer insulating layer 218 can be formed using a material including an inorganic insulating material such as silicon oxide, silicon oxynitride, silicon nitride, hafnium oxide, aluminum oxide, or tantalum oxide. Note that although a stacked structure of the interlayer insulating layer 216 and the interlayer insulating layer 218 is used in this embodiment, an embodiment of the invention disclosed herein is not limited thereto. A single-layer structure or a stacked structure including three or more layers can also be used.

Note that the interlayer insulating layer 218 is preferably formed so as to have a planarized surface. This is because an electrode, a wiring, or the like can be favorably formed over the interlayer insulating layer 218 when the interlayer insulating layer 218 is formed so as to have a planarized surface.

Through the above steps, a transistor 250 including the highly-purified oxide semiconductor layer 206a is completed (see FIG. 11E).

The transistor 250 illustrated in FIG. 11E includes the following: the oxide semiconductor layer 206a provided over the bottom substrate 200 with the insulating layer 202 interposed therebetween; the source or drain electrode 208a and the source or drain electrode 208b electrically connected to the oxide semiconductor layer 206a; the gate insulating layer 212 covering the oxide semiconductor layer 206a, the source or drain electrode 208a, and the source or drain electrode 208b; the gate electrode 214 over the gate insulating layer 212; the interlayer insulating layer 216 over the gate insulating layer 212 and the gate electrode 214; and the interlayer insulating layer 218 over the interlayer insulating layer 216.

In the transistor 250 described in this embodiment, the oxide semiconductor layer 206a is highly purified. Therefore, the concentration of hydrogen in the oxide semiconductor layer 206a is less than or equal to $5 \times 10^{19}$ atoms/cm$^3$, preferably less than or equal to $5 \times 10^{18}$ atoms/cm$^3$, or more preferably less than or equal to $5 \times 10^{17}$ atoms/cm$^3$. In addition, the carrier density of the oxide semiconductor layer 206a is sufficiently low (e.g., less than $1 \times 10^{12}$/cm$^3$, preferably less than $1.45 \times 10^{10}$/cm$^3$) as compared to that of a typical silicon wafer (approximately $1 \times 10^{14}$/cm$^3$). As a result of this, a sufficiently low off current can be obtained. For example, in the case where a channel length is 10 μm, the thickness of the oxide semiconductor layer is 30 nm, and a drain voltage ranges from approximately 1 V to 10 V, off current (a drain current when a gate-source voltage is less than or equal to 0 V) is less than or equal to $1 \times 10^{-13}$ A. In addition, off current density (a value obtained by dividing the off current by the channel width of the transistor) at room temperature is approximately $1 \times 10^{-20}$ A/m (10 zA/m) to $1 \times 10^{-19}$ A/m (100 zA/m).

Note that characteristics of the above transistor can be represented using off resistance (a resistance value when the transistor is turned off) or off resistivity (resistivity when the transistor is turned off) in addition to the off current or the off current density. Here, off resistance R is obtained by Ohm's law with the use of the off current and the drain voltage. In addition, with the use of a cross-sectional area A of a channel formation region and a channel length L, off resistivity ρ is obtained by the formula of ρ=RA/L. Specifically, in the above case, the off resistivity is greater than or equal to $1 \times 10^9$ Ω·m (or greater than or equal to $1 \times 10^{10}$ Ω·m). Note that with the use of the thickness d of the oxide semiconductor layer and the channel width W, the cross-sectional area A is represented by the formula of A=dW.

With the use of the oxide semiconductor layer 206a, which is highly purified to be an intrinsic oxide semiconductor layer in such a manner, the off current of the transistor can be reduced sufficiently.

Note that although, in this embodiment, the transistor 250 is used instead of the transistor 162 shown in the above embodiments, the invention disclosed herein does not need to be construed as being limited to that case. For example, when the electric characteristics of an oxide semiconductor are sufficiently increased, the oxide semiconductor can be used for all the transistors including transistors included in an integrated circuit. In such a case, it is not necessary to employ a stacked-layer structure as shown in the above embodiments. Note that in order to realize favorable circuit operation, the filed-effect mobility μ of the oxide semiconductor is preferably μ>100 cm$^2$/V·s. In addition, a semiconductor device can be formed using, for example, a substrate such as a glass substrate.

The structures, methods, and the like described in this embodiment can be combined as appropriate with any of the structures, methods, and the like described in the other embodiments.

Embodiment 6

Next, another example of the manufacturing method of a transistor including an oxide semiconductor which can be used as the transistor 162 or the like in the above embodiments (such as Embodiment 1) is described with reference to FIGS. 12A to 12E. In this embodiment, description is made in detail on the case where, as an oxide semiconductor layer, a first oxide semiconductor layer having a crystallized region and a second oxide semiconductor layer that is obtained by crystal growth from the crystallized region of the first oxide semiconductor layer are used. Although a top-gate transistor is used as an example in the following description, the structure of the transistor is not limited thereto.

First, an insulating layer 302 is formed over a lower layer substrate 300. Next, a first oxide semiconductor layer is formed over the insulating layer 302, and then subjected to first heat treatment so that a region including at least a surface of the first oxide semiconductor layer is crystallized, whereby a first oxide semiconductor layer 304 is formed (see FIG. 12A).

For example, the lower layer substrate 300 can be a structure body below the interlayer insulating layer 128 of the semiconductor device in the above embodiment (FIGS. 1A and 1B, FIGS. 6A and 6B, or the like). For the details thereof, the above embodiment can be referred to. It is preferable that a surface of the lower layer substrate 300 be as flat as possible. For example, difference in height on the surface may be less than or equal to 5 nm, or preferable less than or equal to 1 nm by a chemical mechanical polishing method (a CMP method) or the like. In addition, a root-mean-square (RMS) of a surface roughness may be less than or equal to 2 nm, or preferable less than or equal to 0.4 nm.

The insulating layer 302 serves as a base and can be formed in a manner similar to that of the insulating layer 138, the insulating layer 144, or the like described in the above embodiments. The above embodiments can be referred to for details of the insulating layer 302. Note that it is preferable to form the insulating layer 302 so as to contain hydrogen or water as little as possible.

The first oxide semiconductor layer can be formed in a manner similar to that of the oxide semiconductor layer 206 described in the above embodiment. The above embodiment can be referred to for details of the first oxide semiconductor layer and a manufacturing method thereof. Note that in this embodiment, the first oxide semiconductor layer is intentionally crystallized through the first heat treatment; therefore, the first oxide semiconductor layer is preferably formed using an oxide semiconductor which causes crystallization easily. For example, ZnO or the like can be given as such an oxide semiconductor. Further, it is also preferable to use an In—Ga—Zn—O-based oxide semiconductor in which the proportion of Zn in metal elements (In, Ga, Zn) is greater than or equal to 60%, because an In—Ga—Zn—O-based oxide semiconductor containing Zn at high concentration is easily crystallized. The thickness of the first oxide semiconductor layer is preferably greater than or equal to 3 nm and less than or equal to 15 nm, and in this embodiment, 5 nm for example. Note that the appropriate thickness of the first oxide semiconductor layer differs depending on the oxide semiconductor material to be used, the intended purpose of a semiconductor device, or the like; therefore, the thickness may be determined in accordance with the material, the intended purpose, or the like.

The first heat treatment is performed at a temperature higher than or equal to 550° C. and lower than or equal to 850° C., preferably higher than or equal to 600° C. and lower than or equal to 750° C. The time for the first heat treatment is preferably longer than or equal to 1 minute and shorter than or equal to 24 hours. The temperature and time of the heat treatment differ depending on the kind or the like of the oxide semiconductor. In addition, the first heat treatment is preferably performed in an atmosphere that does not contain hydrogen or water, such as an atmosphere of nitrogen, oxygen, or a rare gas (e.g., helium, neon, or argon), from which water is sufficiently removed.

The heat treatment apparatus is not limited to the electric furnace can be an apparatus for heating an object to be processed by thermal conduction or thermal radiation from a medium such as a heated gas. For example, a rapid thermal annealing (RTA) apparatus such as a gas rapid thermal annealing (GRTA) apparatus or a lamp rapid thermal annealing (LRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high-pressure sodium lamp, or a high-pressure mercury lamp. A GRTA apparatus is an apparatus for performing heat treatment using a high-temperature gas. As the gas, an inert gas which does not react with an object to be processed by heat treatment, for example, nitrogen or a rare gas such as argon is used.

Through the aforementioned first heat treatment, a region including at least the surface of the first oxide semiconductor layer is crystallized. The crystallized region is formed in such a manner that crystal growth proceeds from the surface of the first oxide semiconductor layer toward the inside of the first oxide semiconductor layer. Note that in some cases, the crystallized region includes a plate-like crystal with an average thickness of greater than or equal to 2 nm and less than or equal to 10 nm. In some cases, the crystallized region also includes a crystal which has an a-b surface substantially parallel to the surface of the oxide semiconductor layer and is c-axis-aligned in a direction substantially perpendicular to the surface of the oxide semiconductor layer. Here, a "direction substantially parallel" means a direction within ±10° of the parallel direction, and a "direction substantially perpendicular" means a direction within ±10° of the perpendicular direction.

Through the first heat treatment during which the crystallized region is formed, hydrogen (including water or hydroxyl groups) in the first oxide semiconductor layer is preferably removed. In order to remove hydrogen or the like, the first heat treatment may be performed under an atmosphere of nitrogen, oxygen, or a rare gas (e.g., helium, neon, or argon), which has a purity of 6 N (99.9999%) or more (i.e., the impurity concentration is less than or equal to 1 ppm), more preferably a purity of 7 N (99.99999%) or more (i.e., the impurity concentration is less than or equal to 0.1 ppm).

Alternatively, the first heat treatment may be performed in ultra-dry air containing H$_2$O with 20 ppm or less, preferably 1 ppm or less.

Furthermore, through the first heat treatment during which the crystallized region is formed, oxygen is preferably supplied to the first oxide semiconductor layer. Oxygen can be supplied to the first oxide semiconductor layer by, for example, changing the atmosphere for the heat treatment to an oxygen atmosphere.

The first heat treatment in this embodiment is as follows: hydrogen or the like is removed from the oxide semiconductor layer through heat treatment under a nitrogen atmosphere at 700° C. for one hour, and then the atmosphere is changed to an oxygen atmosphere so that oxygen is supplied to the inside of the first oxide semiconductor layer. Note that the main purpose of the first heat treatment is to form the crystallized region; accordingly, treatment for removing hydrogen or the like and treatment for supplying oxygen may be performed separately. For example, heat treatment for crystallization can be performed after heat treatment for removing hydrogen or the like and treatment for supplying oxygen.

Through such first heat treatment, the crystallized region is formed, hydrogen (including water and hydroxyl groups) or the like is removed, and the first oxide semiconductor layer supplied with oxygen can be obtained.

Figure 12A:
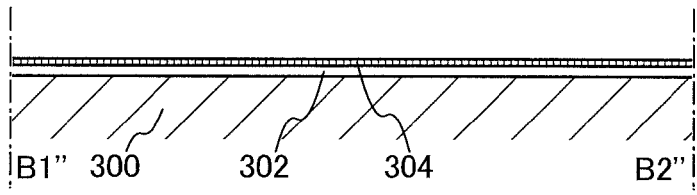
FIGS. 12A to 12E are cross-sectional views relating to manufacturing steps of a semiconductor device.
Figure 12B:
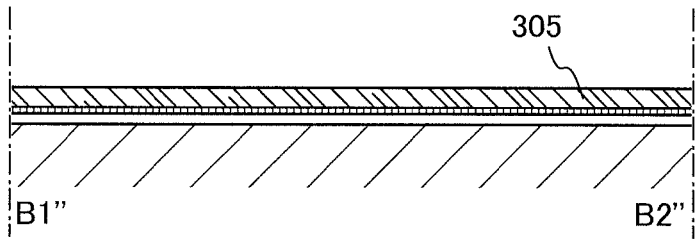

Next, a second oxide semiconductor layer 305 is formed over the first oxide semiconductor layer 304 including the crystallized region at least on its surface (see FIG. 12B).

The second oxide semiconductor layer 305 can be formed in a manner similar to that of the oxide semiconductor layer 206 shown in the above embodiments. The above embodiments can be referred to for details of the second oxide semiconductor layer 305 and a manufacturing method thereof. Note that the second oxide semiconductor layer 305 is preferably formed to be thicker than the first oxide semiconductor layer 304. Further, the second oxide semiconductor layer 305 is preferably formed so that the total thickness of the first oxide semiconductor layer 304 and the second oxide semiconductor layer 305 are greater than or equal to 3 nm and less than or equal to 50 nm. Note that the appropriate thickness of the oxide semiconductor layer differs depending on the oxide semiconductor material to be used, the intended purpose of a semiconductor device, or the like; therefore, the thickness may be determined in accordance with the material, the intended purpose, or the like.

The second oxide semiconductor layer 305 and the first oxide semiconductor layer 304 are preferably formed using materials which have the same main component and have close lattice constants after crystallization (lattice mismatch is less than or equal to 1%). This is because in the crystallization of the second oxide semiconductor layer 305, crystal growth easily proceeds from the crystallized region of the first oxide semiconductor layer 304 in the case where materials having the same main component are used. In addition, the use of materials having the same main component realizes favorable interface physical properties or electric characteristics.

Note that in the case where a desired film quality is obtained through crystallization, the second oxide semiconductor layer 305 may be formed using a material which has a main component different from that of the material of the first oxide semiconductor layer 304.

Figure 12C:
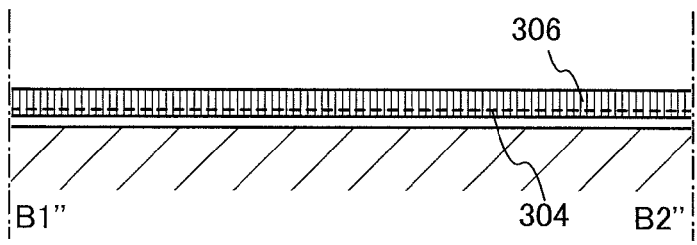

Next, second heat treatment is performed on the second oxide semiconductor layer 305, whereby crystal growth proceeds from the crystallized region of the first oxide semiconductor layer 304, and a second oxide semiconductor layer 306 is formed (see FIG. 12C).

The second heat treatment is performed at a temperature higher than or equal to 550° C. and lower than or equal to 850° C., preferably higher than or equal to 600° C. and lower than or equal to 750° C. The time for the second heat treatment is 1 minute to 100 hours inclusive, preferably 5 hours to 20 hours inclusive, and typically 10 hours. Note that also the second heat treatment is preferably performed under an atmosphere that does not contain hydrogen or water.

Details of the atmosphere and the effect of the heat treatment are similar to those of the first heat treatment. The heat treatment apparatus that can be used is also similar to that of the first heat treatment. For example, in the second heat treatment, a furnace is filled with a nitrogen atmosphere when a temperature rises, and the furnace is filled with an oxygen atmosphere when the temperature falls, whereby hydrogen or the like can be removed under the nitrogen atmosphere and oxygen can be supplied under the oxygen atmosphere.

Through the aforementioned second heat treatment, crystal growth can proceed from the crystallized region of the first oxide semiconductor layer 304 to the whole of the second oxide semiconductor layer 305, so that the second oxide semiconductor layer 306 can be formed. In addition, it is possible to form the second oxide semiconductor layer 306 from which hydrogen (including water and hydroxyl groups) or the like is removed and to which oxygen is supplied. Furthermore, the orientation of the crystallized region of the first oxide semiconductor layer 304 can be improved through the second heat treatment.

For example, in the case where an In—Ga—Zn—O-based oxide semiconductor material is used for the second oxide semiconductor layer 306, the second oxide semiconductor layer 306 can include a crystal represented by InGaO$_3$(ZnO)$_m$ (m is a natural number), a crystal represented by In$_2$Ga$_2$ZnO$_7$ (In:Ga:Zn:O=2:2:1:7), or the like. Such crystals are aligned through the second heat treatment so that a c-axis is in a direction substantially perpendicular to the surface of the second oxide semiconductor layer 306a.

Here, the aforementioned crystals include any of In, Ga, and Zn, and can be considered to have a stacked-layer structure of layers parallel to an a-axis and a b-axis. Specifically, the aforementioned crystals have a structure in which a layer containing In and a layer not containing In (a layer containing Ga or Zn) are stacked in the c-axis direction.

In an In—Ga—Zn—O-based oxide semiconductor crystal, a layer containing In in an in-plane direction, that is, a layer in a direction parallel to the a-axis and the b-axis has favorable conductivity. This is because electrical conduction in the In—Ga—Zn—O-based oxide semiconductor crystal is mainly controlled by In, and the 5 s orbital of an In atom overlaps with the 5 s orbital of an adjacent In atom, so that a carrier path is formed.

Further, in the case where the first oxide semiconductor layer 304 includes an amorphous region at the interface with the insulating layer 302, through the second heat treatment, crystal growth proceeds in some cases from the crystallized region formed on the surface of the first oxide semiconductor layer 304 toward the bottom of the first oxide semiconductor layer to crystallize the amorphous region. Note that in some cases, the amorphous region remains depending on the material of the insulating layer 302, the heat treatment conditions, and the like.

In the case where the first oxide semiconductor layer 304 and the second oxide semiconductor layer 305 are formed using oxide semiconductor materials having the same main component, in some cases, the first oxide semiconductor layer 304 and the second oxide semiconductor layer 306 have the same crystal structure, as illustrated in FIG. 12C. Therefore, although indicated by a dotted line in FIG. 12C, the boundary between the first oxide semiconductor layer 304 and the second oxide semiconductor layer 306 cannot be distinguished in some cases so that the first oxide semiconductor layer 304 and the second oxide semiconductor layer 306 can be considered as the same layer.

Figure 12D:
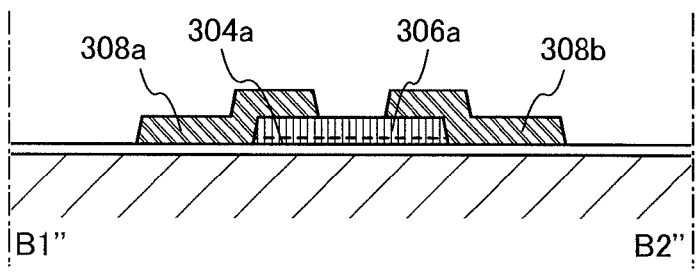

Next, the first oxide semiconductor layer 304 and the second oxide semiconductor layer 306 are processed with a method such as etching using a mask, whereby an island-shaped first oxide semiconductor layer 304a and an island-shaped second oxide semiconductor layer 306a are formed (see FIG. 12D). Note that here, processing into the island-shaped oxide semiconductor is performed after the second heat treatment; however, the second heat treatment may be performed after processing into the island-shaped oxide semiconductor layer. In this case, there is an advantage that time for etching can be shortened even when wet etching is used.

As an etching method for the first oxide semiconductor layer 304 and the second oxide semiconductor layer 306, either dry etching or wet etching may be employed. It is needless to say that dry etching and wet etching can be used in combination. The etching conditions (e.g., an etching gas or an etchant, etching time, and temperature) are set as appropriate depending on the material so that the oxide semiconductor layer can be etched into a desired shape. The first oxide semiconductor layer 304 and the second oxide semiconductor layer 306 can be etched in a manner similar to that of the oxide semiconductor layer shown in the above embodiments. The above embodiments can be referred to for details of the etching.

A region of the oxide semiconductor layers, which becomes a channel formation region, preferably has a planarized surface. For example, the surface of the second oxide semiconductor layer 306 preferably has a peak-to-valley height of 1 nm or less (more preferably 0.2 nm or less) in a region overlapping with a gate electrode (the channel formation region).

Next, a conductive layer is formed to be in contact with the second oxide semiconductor layer 306a. Then, a source or drain electrode 308a and a source or drain electrode 308b are formed by selectively etching the conductive layer (see FIG. 12D). The source or drain electrode 308a and the source or drain electrode 308b can be formed in a manner similar to that of the source or drain electrode 142a and the source or drain electrode 142b shown in the above embodiments. The above embodiments can be referred to for details of the source or drain electrode 308a and the source or drain electrode 308b.

In the step illustrated in FIG. 12D, crystal layers on the side surfaces of the first oxide semiconductor layer 304a and the second oxide semiconductor layer 306a, which are in contact with the source or drain electrode 308a and the source or drain electrode 308b, are brought into an amorphous state in some cases. For this reason, all the regions of the first oxide semiconductor layer 304a and the second oxide semiconductor layer 306a do not always have a crystal structure.

Next, a gate insulating layer 312 in contact with part of the second oxide semiconductor layer 306a is formed. The gate insulating layer 312 can be formed with a CVD method or a sputtering method. Then, a gate electrode 314 is formed over the gate insulating layer 312 in a region overlapping with the first oxide semiconductor layer 304a and the second oxide semiconductor layer 306a. After that, an interlayer insulating layer 316 and an interlayer insulating layer 318 are formed over the gate insulating layer 312 and the gate electrode 314 (see FIG. 12E). The gate insulating layer 312, the gate electrode 314, the interlayer insulating layer 316, and the interlayer insulating layer 318 can be formed in a manner similar to that of the insulating layer 138, the gate electrode 148a, the interlayer insulating layer 216, the interlayer insulating layer 218, or the like shown in the above embodiments. The above embodiments can be referred to for details of the gate insulating layer 312, the gate electrode 314, the interlayer insulating layer 316, and the interlayer insulating layer 318.

After the gate insulating layer 312 is formed, third heat treatment is preferably performed under an inert gas atmosphere or an oxygen atmosphere. The third heat treatment is performed at a temperature higher than or equal to 200° C. and lower than or equal to 450° C., preferably higher than or equal to 250° C. and lower than or equal to 350° C. For example, the heat treatment may be performed at 250° C. for one hour under an atmosphere containing oxygen. The third heat treatment can reduce variation in electric characteristics of the transistor. In the case where the gate insulating layer 312 contains oxygen, by supplying oxygen to the second oxide semiconductor layer 306a to make up oxygen deficiency of the second oxide semiconductor layer 306a, an i-type (intrinsic) or substantially i-type oxide semiconductor layer can also be formed.

Note that although the third heat treatment is performed in this embodiment after the gate insulating layer 312 is formed, the timing of the third heat treatment is not limited thereto. Further, the third heat treatment may be omitted in the case where oxygen is supplied to the second oxide semiconductor layer through other treatment such as the second heat treatment.

Through the above steps, a transistor 350 is completed. The transistor 350 uses the first oxide semiconductor layer 304a and the second oxide semiconductor layer 306a which is obtained by crystal growth from the crystallized region of the first oxide semiconductor layer 304a (see FIG. 12E).

Figure 12E:
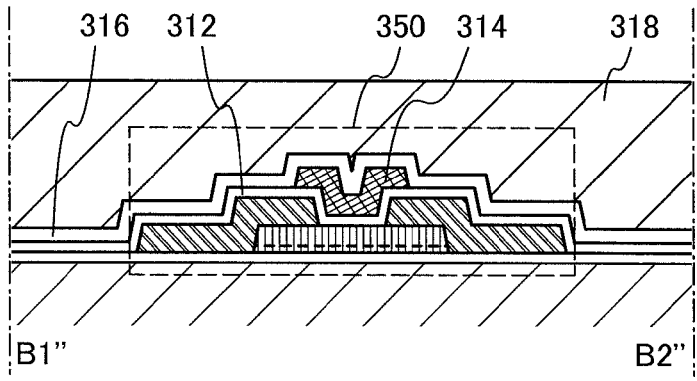

The transistor 350 illustrated in FIG. 12E includes the following: the first oxide semiconductor layer 304a provided over the bottom substrate 300 with the insulating layer 302 interposed therebetween; the second oxide semiconductor layer 306a provided over the first oxide semiconductor layer 304a; the source or drain electrode 308a and the source or drain electrode 308b electrically connected to the second oxide semiconductor layer 306a; the gate insulating layer 312 covering the second oxide semiconductor layer 306a, the source or drain electrode 308a, and the source or drain electrode 308b; the gate electrode 314 over the gate insulating layer 312; the interlayer insulating layer 316 over the gate insulating layer 312 and the gate electrode 314; and the interlayer insulating layer 318 over the interlayer insulating layer 316.

In the transistor 350 shown in this embodiment, the first oxide semiconductor layer 304a and the second oxide semiconductor layer 306a are highly purified. Therefore, the concentration of hydrogen in the first oxide semiconductor layer 304a and the second oxide semiconductor layer 306a is less than or equal to $5 \times 10^{19}/cm^3$, preferably less than or equal to $5 \times 10^{18}/cm^3$, and more preferably less than or equal to $5 \times 10^{12}/cm^3$. In addition, the carrier density of the oxide semiconductor layer is sufficiently low (e.g., less than $1 \times 10^{12}/cm^3$, preferably less than $1.45 \times 10^{10}/cm^3$) as compared to that of a typical silicon wafer (approximately $1 \times 10^{14}/cm^3$). As a result of this, a sufficiently low off-state current can be obtained. For example, in the case where a channel length of the transistor is 10 μm and the thickness of the oxide semiconductor layer is 30 nm, when a drain voltage ranges from 1 V to 10 V, the off current (a drain current when a gate-source voltage is less than or equal to 0 V) is less than or equal to $1 \times 10^{-13}$ A. Further, off current density (a value obtained by dividing the off current by a channel width of the transistor) at room temperature is approximately $1×10^{-20}$ A/m (10 zA/m) to $1×10^{-19}$ A/m (100 zA/m).

Note that characteristics of the above transistor can be represented using off resistance (a resistance value when the transistor is turned off) or off resistivity (resistivity when the transistor is turned off) in addition to the off current or the off current density. Here, with the use of the off current and the drain voltage, off resistance R is a value obtained by Ohm's law. In addition, with the use of a cross-sectional area A of a channel formation region and a channel length L, off resistivity ρ is a value obtained by the formula of ρ=RA/L. Specifically, in the above case, the off resistivity is greater than or equal to $1×10^9$ Ω·m (or greater than or equal to $1×10^{10}$ Ω·m). Note that with the use of the thickness d of the oxide semiconductor layer and the channel width W, the cross-sectional area A is represented by the formula of A=dW.

In this manner, by using the highly-purified and intrinsic first oxide semiconductor layer 304a and second oxide semiconductor layer 306a, the off current of the transistor can be sufficiently reduced.

Furthermore, in this embodiment, the first oxide semiconductor layer 304a having a crystallized region and the second oxide semiconductor layer 306a which is obtained by crystal growth from the crystallized region of the first oxide semiconductor layer 304a are used as the oxide semiconductor layer. Thus, the field-effect mobility can be increased and a transistor with favorable electric characteristics can be realized.

Note that although, in this embodiment, the transistor 350 is used instead of the transistor 162 shown in the above embodiment, the invention disclosed herein does not need to be construed as being limited to that case. For example, the transistor 350 shown in this embodiment uses the first oxide semiconductor layer 304a having a crystallized region and the second oxide semiconductor layer 306a which is obtained by crystal growth from the crystallized region of the first oxide semiconductor layer 304a, and thus has a high field-effect mobility. Accordingly, the oxide semiconductor can be used for all the transistors including transistors included in an integrated circuit. In such a case, it is not necessary to employ a stacked-layer structure as shown in the above embodiments. Note that in order to realize favorable circuit operation, the filed-effect mobility μ of the oxide semiconductor is preferably μ >100 cm$^2$/V·s. In addition, in this case, a semiconductor device can be formed using, for example, a substrate such as a glass substrate.

The structures, methods, and the like described in this embodiment can be combined as appropriate with any of the structures, methods, and the like described in the other embodiments.

Embodiment 7

In this embodiment, a method for manufacturing a semiconductor device which is different from the method for manufacturing a semiconductor device described in Embodiment 1 is described. A feature of this embodiment is that a gate electrode of a transistor in a lower portion is formed by a so-called damascene method, and a source electrode, a drain electrode, and the like of a transistor in an upper portion are formed using the material of the gate electrode.

Figure 13A:
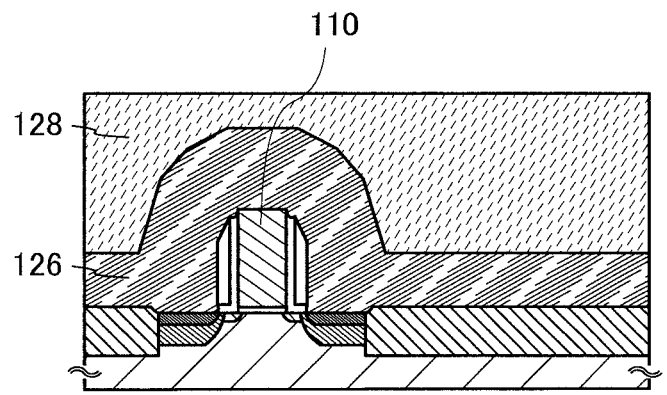
FIGS. 13A to 13D are cross-sectional views relating to manufacturing steps of a semiconductor device.

First, a state of FIG. 4G is obtained by the method described in Embodiment 1. The state is illustrated in FIG. 13A. An interlayer insulating layer 126 and an interlayer insulating layer 128 are polished using a CMP method or the like, so that a top surface of a gate electrode 110 is exposed.

Figure 13B:
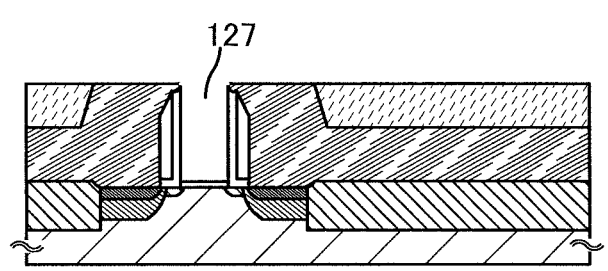

Then, the gate electrode 110 is etched by a selective-etching method, so that a hole portion 127 is formed (see FIG. 13B).

Figure 13C:
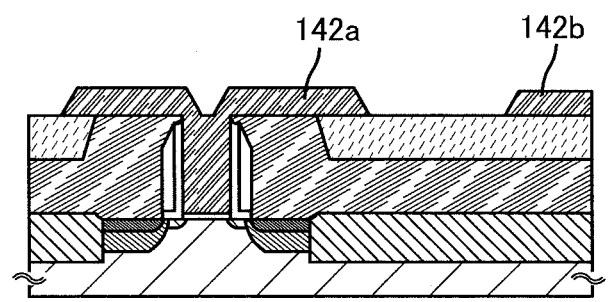

Next, a conductive layer including metal or metal nitride is formed by a deposition method by which the hole portion 127 is completely embedded. The conductive layer may be a single layer or a stacked layer. Then, the conductive layer is etched, so that electrode layers (a source or drain electrode 142a and a source or drain electrode 142b) are obtained (see FIG. 13C). A structure at this stage is equivalent to the structure of FIG. 5B described in Embodiment 1.

Figure 13D:
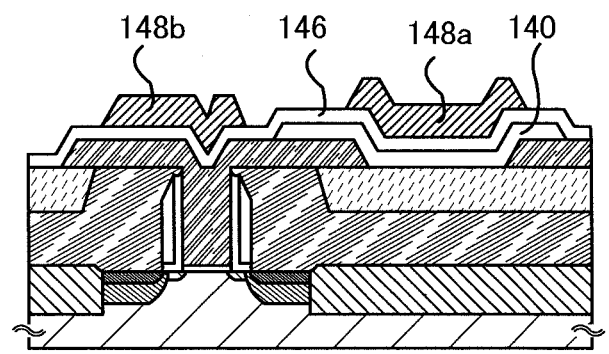

After that, in a similar manner to Embodiment 1, an island-shaped oxide semiconductor layer 140, a gate insulating layer 146, a gate electrode 148a, and an electrode 148b are formed (see FIG. 13D). It is noted that the electrode layer (the source or drain electrode 142a) is the gate electrode of the transistor in the lower portion and also the source or drain electrode of the transistor in the upper portion. In this embodiment, a step for forming a contact hole reaching the gate electrode 110 of the transistor in the lower portion, which is needed in Embodiment 1, can be omitted. In this embodiment, since the island-shaped oxide semiconductor layer 140 is in contact with the interlayer insulating layer 128, a surface of the interlayer insulating layer 128 is preferably dehydrogenated sufficiently before the island-shaped oxide semiconductor layer 140 is formed.

Embodiment 8

In this embodiment, the case where the semiconductor device described in the above embodiments is applied to electronic appliances is described with reference to FIGS. 14A to 14F. The case where the above described semiconductor device is applied to electronic appliances such as a computer, a mobile phone set (also referred to as a mobile phone or a mobile phone device), a personal digital assistant (including a portable game machine, an audio reproducing device and the like), a digital camera, a digital video camera, an electronic paper, a television set (also referred to as a television or a television receiver) and the like is described.

Figure 14A:
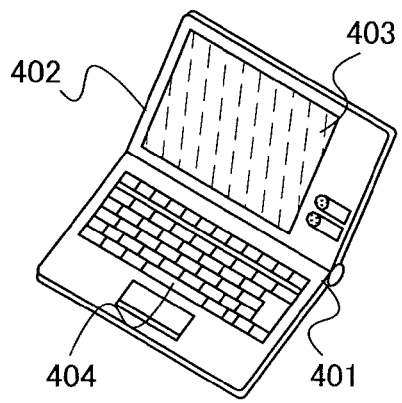
FIGS. 14A to 14F are perspective views for describing electronic appliances.

FIG. 14A shows a notebook personal computer including a housing 401, a housing 402, a display portion 403, a keyboard 404 and the like. The semiconductor device shown in the foregoing embodiment is provided in the housing 401 and the housing 402. Thus, a notebook PC with sufficiently low power consumption in which writing and reading of data can be performed at high speed and data can be stored for a long time can be realized.

Figure 14D:
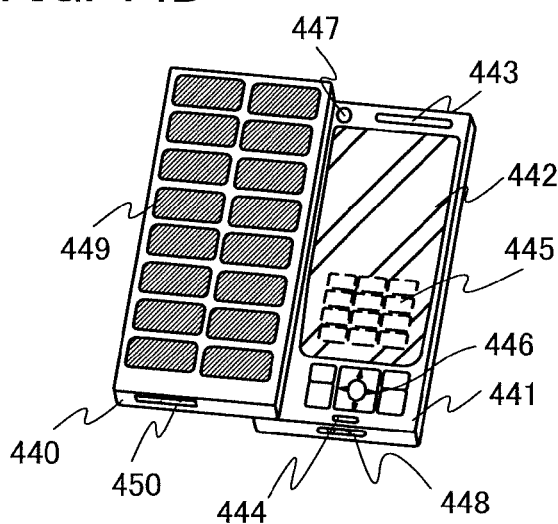
Figure 14B:
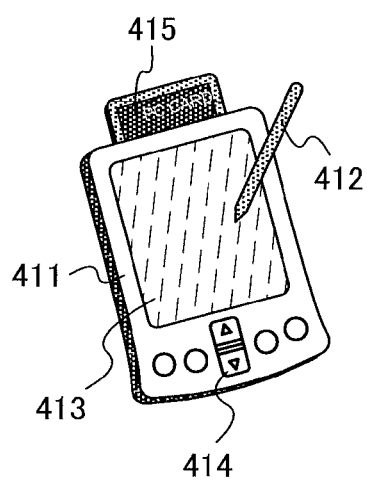

FIG. 14B shows a personal digital assistant (PDA) including a main body 411 provided with a display portion 413, an external interface 415, an operation button 414, and the like. A stylus 412 and the like operating the personal digital assistant are also provided. The semiconductor device shown in the foregoing embodiment is provided in the main body 411. Therefore, a personal digital assistant with sufficiently low power consumption in which writing and reading of data can be performed at high speed and data can be stored for a long time can be realized.

Figure 14E:
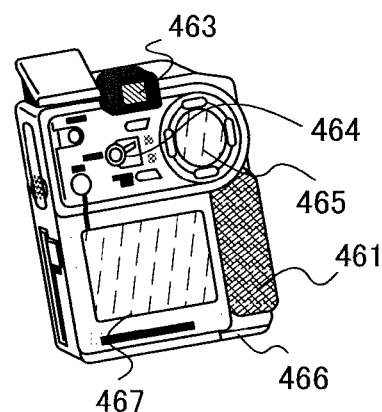
Figure 14C:
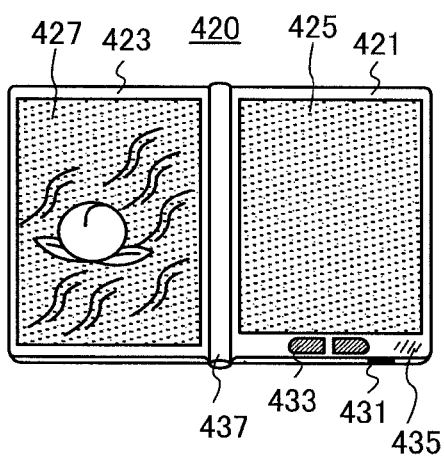

FIG. 14C shows an e-book reader 420 with electronic paper attached including two housings 421 and 423. A display portion 425 and a display portion 427 are provided in the housing 421 and the housing the 423, respectively. The housings 421 and 423 are connected by a hinge portion 437 and can be opened or closed with the hinge portion 437. The housing 421 is provided with a power switch 431, operation keys 433, a speaker 435 and the like. The semiconductor device shown in the above embodiment is provided at least in one of the housings 421 and 423. Therefore, an e-book reader with sufficiently low power consumption in which writing and reading of data can be performed at high speed and data can be stored for a long time can be realized.

FIG. 14D is a mobile phone including two housings 440 and 441. Moreover, the housings 440 and 441 which are shown unfolded in FIG. 14D can overlap with each other by sliding. Thus, the mobile phone can be in a suitable size for portable use. The housing 441 includes a display panel 442, a speaker 443, a microphone 444, a pointing device 446, a camera lens 447, an external connection terminal 448 and the like. The housing 440 is provided with a solar cell 449 for charging the mobile phone, an external memory slot 450 and the like. In addition, an antenna is incorporated in the housing 441. The semiconductor device shown in the above embodiment is provided at least in one of the housings 440 and 441. Thus, a mobile phone with sufficiently low power consumption in which writing and reading of data can be performed at high speed and data can be stored for a long time can be realized.

FIG. 14E is a digital camera including a main body 461, a display portion 467, an eyepiece portion 463, an operation switch 464, a display portion 465, a battery 466 and the like. The semiconductor device shown in the foregoing embodiment is provided in the main body 461. Therefore, a digital camera with sufficiently low power consumption in which writing and reading of data can be performed at high speed and data can be stored for a long time can be realized.

Figure 14F:
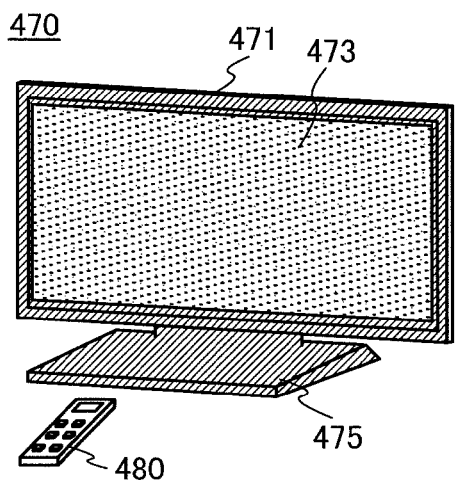

FIG. 14F is a television set 470 including a housing 471, a display portion 473, a stand 475 and the like. The television set 470 can be operated by an operation switch of the housing 471 and a remote controller 480. The semiconductor device shown in the above embodiment is mounted in the housing 471 and the remote controller 480. Thus, a television set with sufficiently low power consumption in which writing and reading of data can be performed at high speed and data can be stored for a long time can be realized.

As described above, a semiconductor device related to the above embodiment is mounted in the electronic appliances shown in this embodiment. Therefore, an electronic appliance whose power consumption is sufficiently reduced can be realized.

Example 1

The number of times the semiconductor device according to an embodiment of the disclosed invention can rewrite data was examined. In this example, the examination results are described with reference to FIG. 15.

A semiconductor device used for the examination is the semiconductor device having the circuit configuration in FIG. 3A1. Here, an oxide semiconductor was used in a transistor corresponding to a transistor 162. In addition, as a capacitor corresponding to a capacitor 164, a capacitor having a capacitance value of 0.33 pF was used.

The examination was performed by comparing the initial memory window width and the memory window width at the time after retention and writing data were repeated predetermined times. Data was retained and written by applying 0 V or 5 V to a wiring corresponding to the third wiring in FIG. 3A1 and applying 0 V or 5 V to a wiring corresponding to the fourth wiring in FIG. 3A1. When the potential of the wiring corresponding to the fourth wiring is 0 V, the transistor corresponding to the transistor 162 is off; thus, a potential supplied to a floating gate portion FG is retained. When the potential of the wiring corresponding to the fourth wiring is 5 V, the transistor corresponding to the transistor 162 is on; thus, a potential of the wiring corresponding to the third wiring is supplied to the floating gate portion FG.

The memory window width is one of indicators of characteristics of a memory device. Here, the memory window width represents the shift amount $\Delta V_{cg}$ in curves ($V_{cg}$–$I_d$ curves) between different memory states, which show the relation between the potential Vcg of a wiring corresponding to the fifth wiring and a drain current $I_d$ of a transistor corresponding to the transistor 160. The different memory states mean a state where 0 V is applied to the floating gate portion FG (hereinafter referred to as a low state) and a state where 5 V is applied to the floating gate FG (hereinafter referred to as a high state). That is, the memory window width can be checked by sweeping the potential $V_{cg}$ in the low state and in the high state.

Figure 15:
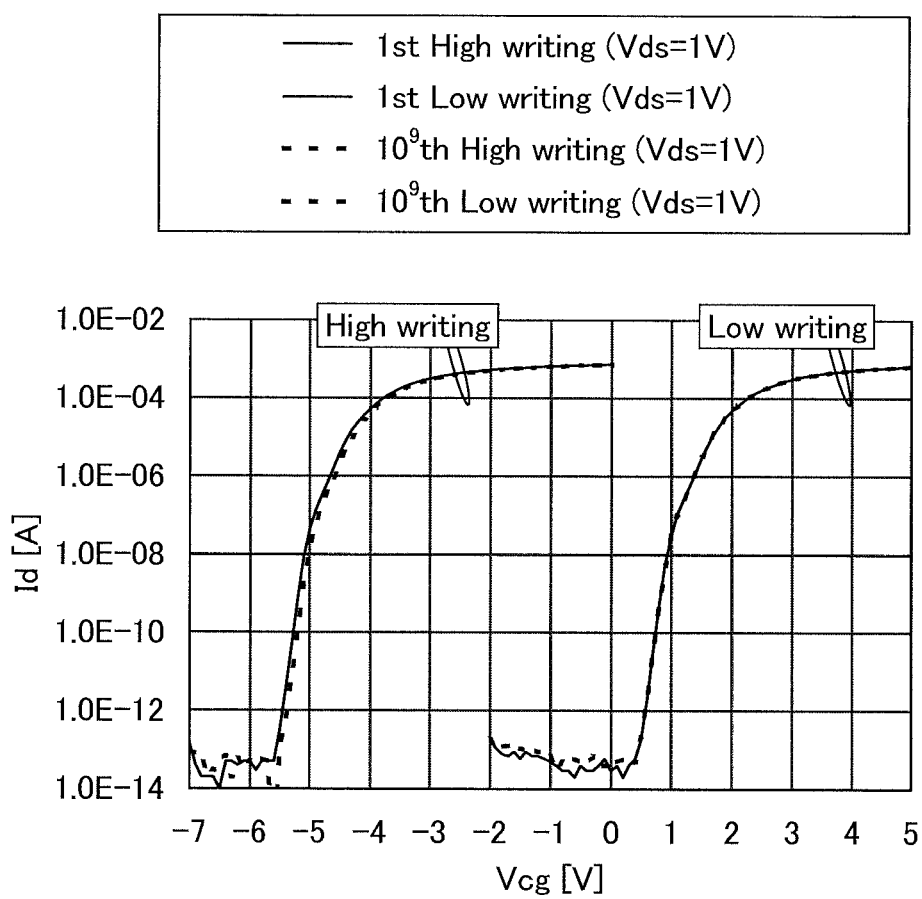
FIG. 15 is a graph showing investigation results of a memory window width.

FIG. 15 shows the examination results of the initial memory window width and the memory window width at the time after writing is performed $1 \times 10^9$ times. Note that in FIG. 15, the horizontal axis shows a $V_{cg}$ (V) and the vertical axis shows $I_d$ (A). It can be confirmed from FIG. 15 that the memory window width is not changed between before and after writing is performed $1 \times 10^9$ times. From the fact that the memory window width is not changed between before and after writing is performed $1 \times 10^9$ times, it is shown that the semiconductor device is not deteriorated at least during the writing.

As described above, characteristics of the semiconductor device according to an embodiment of the disclosed invention are not changed even when retention and writing are repeated many times. That is, according to an embodiment of the disclosed invention, a semiconductor device with extremely high reliability can be obtained.

This application is based on Japanese Patent Application serial no. 2009-288474 filed with Japan Patent Office on Dec. 18, 2009 and Japanese Patent Application serial no. 2009-294790 filed with Japan Patent Office on Dec. 25, 2009, the entire contents of which are hereby incorporated by reference.

The invention claimed is:

1. A semiconductor device comprising:
 a memory cell comprising:
  a first transistor comprising:
   a first conductive layer;
   a second conductive layer;
   an oxide semiconductor layer electrically connected to the first conductive layer and the second conductive layer;
   a first insulating layer over the first conductive layer, the second conductive layer, and the oxide semiconductor layer; and
   a third conductive layer over the first insulating layer, wherein the third conductive layer and the oxide semiconductor layer are overlapped with each other; and
  a fourth conductive layer over the first insulating layer, wherein the fourth conductive layer and the first conductive layer are overlapped with each other,
 wherein the oxide semiconductor layer comprises indium and zinc,
 wherein the oxide semiconductor layer comprises a channel formation region of the first transistor, and
 wherein the first conductive layer and the fourth conductive layer are electrically insulated from each other to compose a capacitor.

2. The semiconductor device according to claim 1, wherein one of the first conductive layer and the second conductive layer is a source electrode, wherein the other of the first conductive layer and the second conductive layer is a drain electrode, and
wherein the third conductive layer is a gate electrode.

3. The semiconductor device according to claim 1, wherein the first conductive layer, the first insulating layer, and the fourth conductive layer compose the capacitor.

4. The semiconductor device according to claim 1, wherein the oxide semiconductor layer further comprises gallium.

5. The semiconductor device according to claim 1, wherein the first conductive layer and the second conductive layer are located over the oxide semiconductor layer.

6. The semiconductor device according to claim 1, wherein the third conductive layer and the fourth conductive layer are located in parallel.

7. A semiconductor device comprising:
   a memory cell comprising:
      a first transistor comprising:
         a first conductive layer;
         a second conductive layer;
         an oxide semiconductor layer electrically connected to the first conductive layer and the second conductive layer;
         a first insulating layer over the first conductive layer, the second conductive layer, and the oxide semiconductor layer; and
         a third conductive layer over the first insulating layer, wherein the third conductive layer and the oxide semiconductor layer are overlapped with each other; and
      a fourth conductive layer over the first insulating layer, wherein the fourth conductive layer and the first conductive layer are overlapped with each other,
   wherein the oxide semiconductor layer comprises indium and zinc,
   wherein the oxide semiconductor layer has a carrier density of less than $1 \times 10^{12}/cm^3$,
   wherein the oxide semiconductor layer comprises a channel formation region of the first transistor, and
   wherein the first conductive layer and the fourth conductive layer are electrically insulated from each other to compose a capacitor.

8. The semiconductor device according to claim 7,
   wherein one of the first conductive layer and the second conductive layer is a source electrode,
   wherein the other of the first conductive layer and the second conductive layer is a drain electrode, and
   wherein the third conductive layer is a gate electrode.

9. The semiconductor device according to claim 7, wherein the first conductive layer, the first insulating layer, and the fourth conductive layer compose the capacitor.

10. The semiconductor device according to claim 7, wherein the oxide semiconductor layer further comprises gallium.

11. The semiconductor device according to claim 7, wherein the first conductive layer and the second conductive layer are located over the oxide semiconductor layer.

12. The semiconductor device according to claim 7, wherein the third conductive layer and the fourth conductive layer are located in parallel.

13. A semiconductor device comprising:
   a memory cell comprising:
      a second transistor;
      a second insulating layer over the second transistor and comprising an opening;
      a first transistor comprising:
         a first conductive layer over the second insulating layer and in the opening;
         a second conductive layer over the second insulating layer;
         an oxide semiconductor layer electrically connected to the first conductive layer and the second conductive layer;
         a first insulating layer over the first conductive layer, the second conductive layer, and the oxide semiconductor layer; and
         a third conductive layer over the first insulating layer, wherein the third conductive layer and the oxide semiconductor layer are overlapped with each other; and
      a fourth conductive layer over the first insulating layer, wherein the fourth conductive layer and the first conductive layer are overlapped with each other,
   wherein the first conductive layer is electrically connected to the second transistor,
   wherein the oxide semiconductor layer comprises indium and zinc,
   wherein the oxide semiconductor layer comprises a channel formation region of the first transistor, and
   wherein the first conductive layer and the fourth conductive layer are electrically insulated from each other to compose a capacitor.

14. The semiconductor device according to claim 13,
   wherein one of the first conductive layer and the second conductive layer is a source electrode,
   wherein the other of the first conductive layer and the second conductive layer is a drain electrode, and
   wherein the third conductive layer is a gate electrode.

15. The semiconductor device according to claim 13, wherein the first conductive layer, the first insulating layer, and the fourth conductive layer compose the capacitor.

16. The semiconductor device according to claim 13, wherein the oxide semiconductor layer further comprises gallium.

17. The semiconductor device according to claim 13, wherein the first conductive layer and the second conductive layer are located over the oxide semiconductor layer.

18. The semiconductor device according to claim 13, wherein the third conductive layer and the fourth conductive layer are located in parallel.

19. The semiconductor device according to claim 13, wherein the first conductive layer is electrically connected to a gate of the second transistor.

20. The semiconductor device according to claim 13, wherein a channel formation region of the second transistor is provided in a semiconductor substrate.

21. The semiconductor device according to claim 13, further comprising a fifth conductive layer electrically connecting the first conductive layer and a gate of the second transistor.

22. The semiconductor device according to claim 13, wherein the oxide semiconductor layer has a carrier density of less than $1 \times 10^{12}/cm^3$.

23. The semiconductor device according to claim 13, comprising a plurality of memory cells each comprising the memory cell,
   wherein the plurality of memory cells are connected in series.

24. The semiconductor device according to claim 13, comprising a plurality of memory cells each comprising the memory cell,
   wherein the plurality of memory cells are connected in parallel to one another.

* * * * *